(12) United States Patent
Kawazoe et al.

(10) Patent No.: US 8,865,090 B2
(45) Date of Patent: Oct. 21, 2014

(54) MICRO FLUID SYSTEM SUPPORT AND MANUFACTURING METHOD THEREOF

(75) Inventors: Hiroshi Kawazoe, Shimodate (JP); Akishi Nakaso, Shimodate (JP); Shigeharu Arike, Shimodate (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/501,078

(22) Filed: Jul. 10, 2009

(65) Prior Publication Data

US 2009/0274582 A1  Nov. 5, 2009

Related U.S. Application Data

(62) Division of application No. 10/505,416, filed as application No. PCT/JP03/02066 on Feb. 25, 2003.

(30) Foreign Application Priority Data

Feb. 25, 2002 (JP) ................................. 2002-048580
Oct. 4, 2002 (JP) ................................. 2002-292978
Feb. 24, 2003 (JP) ................................. 2003-046414

(51) Int. Cl.
 *B01L 3/00* (2006.01)
 *B01L 99/00* (2010.01)
 *B01J 19/00* (2006.01)
 *B81C 1/00* (2006.01)

(52) U.S. Cl.
 CPC .... *B01L 3/502707* (2013.01); *B01J 2219/0086* (2013.01); *B01J 2219/00869* (2013.01); *B01J 2219/00788* (2013.01); *B01J 2219/00783* (2013.01); *B01J 2219/00833* (2013.01); *B01J 19/0093* (2013.01); *B01J 2219/00822* (2013.01); *B01L 2400/0655* (2013.01); *B01L 2300/0887* (2013.01); *B01L 2400/0481* (2013.01); *B01L 2300/0874* (2013.01); *B01L 2300/0816* (2013.01); *B01L 2300/0838* (2013.01); *B01L 2200/12* (2013.01); *B81C 2203/032* (2013.01); *B81C 1/00119* (2013.01); *B81C 2201/019* (2013.01); *B81B 2201/051* (2013.01)
 USPC ........................... 422/502; 422/500; 422/503

(58) Field of Classification Search
 USPC ....................................................... 422/100
 See application file for complete search history.

(56) References Cited

U.S. PATENT DOCUMENTS 3,674,602 A   7/1972  Keogh et al.
3,702,658 A   11/1972 McNamara et al.

(Continued)

FOREIGN PATENT DOCUMENTS

DE    43 08 697 A1 *  9/1994
DE    4308697 A1     9/1994

(Continued)

OTHER PUBLICATIONS

Durst et al., Google Machine Translation of DE4308697 A1, Sep. 22, 1994, p. 1-13.*

(Continued)

*Primary Examiner* — In Suk Bullock
*Assistant Examiner* — Robert Eom
(74) *Attorney, Agent, or Firm* — Westerman, Hattori, Daniels & Adrian, LLP

(57) ABSTRACT

A support unit for a microfluidic system includes a first support; a first adhesive layer provided on a surface of the first support; and a hollow filament laid on a surface of the first adhesive layer to have an arbitrary shape and functioning as a flow channel layer of the microfluidic system.

10 Claims, 12 Drawing Sheets

(56) References Cited

U.S. PATENT DOCUMENTS

| | | | |
|---|---|---|---|
| 3,915,652 A | 10/1975 | Natelson | |
| 4,693,778 A | 9/1987 | Swiggett et al. | |
| 4,959,152 A | 9/1990 | Nichols | |
| 4,970,034 A | 11/1990 | Ly et al. | |
| 5,070,606 A * | 12/1991 | Hoopman et al. | 29/890.03 |
| 5,174,900 A | 12/1992 | Nichols et al. | |
| 5,236,665 A | 8/1993 | Mathewson et al. | |
| 5,352,361 A | 10/1994 | Prasad et al. | |
| 5,429,807 A | 7/1995 | Matson et al. | |
| 5,534,328 A | 7/1996 | Ashmead et al. | |
| 5,628,425 A | 5/1997 | Sharp | |
| 5,690,763 A | 11/1997 | Ashmead et al. | |
| 5,779,897 A | 7/1998 | Kalthod et al. | |
| 5,798,143 A * | 8/1998 | Partridge | 427/249.8 |
| 5,799,817 A * | 9/1998 | Sharp | 220/567.1 |
| 5,843,767 A | 12/1998 | Beattie | |
| 5,855,801 A | 1/1999 | Lin et al. | |
| 6,063,589 A * | 5/2000 | Kellogg et al. | 435/24 |
| 6,148,508 A | 11/2000 | Wolk | |
| 6,153,101 A | 11/2000 | Schafer et al. | |
| 6,290,791 B1 | 9/2001 | Shaw et al. | |
| 6,344,229 B2 | 2/2002 | Schubert et al. | |
| 6,387,234 B1 | 5/2002 | Yeung et al. | |
| 6,428,678 B1 | 8/2002 | Rennebeck | |
| 6,436,292 B1 | 8/2002 | Petro | |
| 6,463,312 B1 | 10/2002 | Bergveld et al. | |
| 6,592,559 B1 | 7/2003 | Pakter et al. | |
| 6,632,400 B1 | 10/2003 | Brennen et al. | |
| 6,713,309 B1 | 3/2004 | Anderson et al. | |
| 6,770,246 B1 | 8/2004 | Husek | |
| 6,837,988 B2 | 1/2005 | Leong et al. | |
| 6,846,635 B1 | 1/2005 | Anderson et al. | |
| 6,887,701 B2 | 5/2005 | Anderson et al. | |
| 6,931,277 B1 | 8/2005 | Yuzhakov et al. | |
| 7,048,723 B1 | 5/2006 | Frazier et al. | |
| 7,122,378 B1 | 10/2006 | Akita et al. | |
| 7,195,699 B2 | 3/2007 | Kawazoe et al. | |
| 7,229,538 B2 | 6/2007 | Tseng et al. | |
| 7,556,615 B2 | 7/2009 | Pettis et al. | |
| 7,818,077 B2 | 10/2010 | Bailey | |
| 2002/0015952 A1 | 2/2002 | Anderson et al. | |
| 2002/0185384 A1 | 12/2002 | Leong et al. | |
| 2003/0034295 A1 | 2/2003 | Strano et al. | |
| 2003/0153900 A1 | 8/2003 | Aceti et al. | |
| 2004/0050705 A1 | 3/2004 | Tseng et al. | |
| 2005/0148091 A1 | 7/2005 | Kitaguchi et al. | |
| 2005/0249367 A1 | 11/2005 | Bailey | |
| 2005/0249637 A1 | 11/2005 | Kawazoe et al. | |
| 2007/0183933 A1 | 8/2007 | Kawazoe et al. | |
| 2008/0124242 A1 | 5/2008 | Kawazoe et al. | |
| 2009/0269245 A1 | 10/2009 | Kawazoe et al. | |
| 2009/0274581 A1 | 11/2009 | Kawazoe et al. | |
| 2009/0274583 A1 | 11/2009 | Kawazoe et al. | |
| 2009/0274584 A1 | 11/2009 | Kawazoe et al. | |
| 2009/0274585 A1 | 11/2009 | Kawazoe et al. | |
| 2009/0274586 A1 | 11/2009 | Kawazoe et al. | |
| 2009/0291264 A1 | 11/2009 | Akai et al. | |
| 2011/0036479 A1 | 2/2011 | Kawazoe et al. | |

FOREIGN PATENT DOCUMENTS

| | | |
|---|---|---|
| DE | 101 22 133 A1 | 1/2002 |
| EP | 0521495 A2 | 1/1993 |
| EP | 0 725 272 A1 | 8/1996 |
| EP | 1 486 455 A1 | 12/2004 |
| FR | 2813073 A1 | 2/2002 |
| GB | 2306643 A | 5/1997 |
| JP | 509346 | 4/1975 |
| JP | 62-280367 A | 12/1987 |
| JP | 4-302230 A | 10/1992 |
| JP | 06-082190 A | 3/1994 |
| JP | 7095622 B2 | 10/1995 |
| JP | 08-508197 A | 9/1996 |
| JP | 11-211694 A | 6/1999 |
| JP | 11156184 A | 6/1999 |
| JP | 2000-019145 A | 1/2000 |
| JP | 200019145 A | 1/2000 |
| JP | 2000015065 A | 1/2000 |
| JP | 2000019145 A | 1/2000 |
| JP | 2000-081406 A | 3/2000 |
| JP | 2000246092 A | 9/2000 |
| JP | 2000279827 A | 10/2000 |
| JP | 2001059910 A | 3/2001 |
| JP | 2001-505980 A | 5/2001 |
| JP | 2001-512031 A | 8/2001 |
| JP | 2001-248072 A | 9/2001 |
| JP | 2001264293 A | 9/2001 |
| JP | 2002-503501 A | 2/2002 |
| JP | 2002-505515 A | 2/2002 |
| JP | 2002-292274 A | 10/2002 |
| JP | 2003-138058 A | 5/2003 |
| JP | 2004174701 A | 6/2004 |
| JP | 2005-504255 A | 2/2005 |
| JP | 2005-103750 A | 4/2005 |
| JP | 2005-326068 A | 11/2005 |
| KR | 10-2004-0089663 A | 10/2004 |
| TW | 536524 B | 6/2003 |
| WO | 94/21372 A1 | 9/1994 |
| WO | 9800231 A1 | 1/1998 |
| WO | 98/25065 A1 | 6/1998 |
| WO | 9853046 A1 | 11/1998 |
| WO | 99/06589 A1 | 2/1999 |
| WO | 9941606 A1 | 8/1999 |
| WO | 0016833 A1 | 3/2000 |
| WO | WO 0016833 A1 * | 3/2000 |
| WO | 0108802 A1 | 2/2001 |
| WO | 0109607 A1 | 2/2001 |
| WO | 01/77683 A1 | 10/2001 |
| WO | 03/026875 A1 | 4/2003 |
| WO | 03070623 A1 | 8/2003 |
| WO | 2004/009231 A1 | 1/2004 |

OTHER PUBLICATIONS

Korean Office Action dated Mar. 20, 2006 of corresponding Korean Application No. 10-2004-7013114.

Japanese Office Action dated Oct. 17, 2006 (mailing date), issued in corresponding Japanese Patent Application No. 2003-046414 (partial translation).

Korean Office Action dated Oct. 2, 2006 (mailing date), issued in corresponding Korean Patent Application No. 10-2004-7013114 (partial translation).

Korean Office Action dated Oct. 2, 2006 (mailing date), issued in corresponding Korean Patent Application No. 10-2006-7016790 (partial translation).

Korean Office Action dated Oct. 2, 2006 (mailing date), issued in corresponding Korean Patent Application No. 10-2006-7016791 (partial translation).

European Search Report dated Mar. 5, 2008, issued in corresponding European Patent Application No. 08000280.

European Search Report dated Feb. 19, 2007 issued in counterpart European Application No. 03707062.0.

Shoji, "Flow Control in Microchannels"; Chemical Industry, 52, 4, pp. 42-46, Nov. 2001.

Maeda, "R&D Trends of Microfluidic Device Packaging Technologies", Journal of Japan Institute of Electronics Packaging, vol. 5, No. 1, pp. 25-27, Jan. 2002.

Korenaga, "Indoor/Outdoor Air Pollution and Its Monitoring", 50th National Congress for Environmental Studies, Science Council of Japan, pp. 25-32, 1999.

International Search Report of PCT/JP2005/022002, date of mailing Mar. 7, 2006.

International Search Report of PCT/JP2005/002433, date of mailing Jul. 12, 2005.

European Search Report mailed Mar. 2, 2007, Application No. 05719235.3-2104.

Taiwanese Office Action dated Oct. 23, 2007, Application No. 094104795.

Summons to Attend Oral Hearing dated Apr. 9, 2010, issued in related Patent Application No. 08000283.5.

(56) References Cited

OTHER PUBLICATIONS

Japanese Office Action dated Mar. 2, 2010, issued in corresponding Japanese Patent Application No. 2006-254995.
Summons to Attend Oral Proceedings dated Apr. 9, 2010, issued in related European Patent Application No. 08000280.1.
Summons to Attend Oral Proceedings dated Apr. 9, 2010, issued in related European Patent Application No. 08000281.9.
Summons to Attend Oral Proceedings dated Apr. 9, 2010, issued in related European Patent Application No. 08000285.0.
Summons to Attend Oral Proceedings dated Apr. 9, 2010, issued in related European Patent Application No. 08000282.7.
Summons to Attend Oral Proceedings dated Apr. 9, 2010, issued in related European Patent Application No. 08000284.3.
Japanese Office Action dated Aug. 4, 2009 (dispatch date), issued in corresponding Japanese Patent Application No. 2006-254995.
Chinese Office Action dated Nov. 2, 2010, issued in corresponding Chinese Patent Application No. 2008-101499257.
Chinese Office Action dated Oct. 27, 2010, issued in corresponding Chinese Patent Application No. 2005-80042277.
Japanese Office Action dated Mar. 16, 2010, issued in Japanese Patent Application No. 2007-299538 (With English Translation).
Japanese Office Action dated Mar. 16, 2010, issued in Japanese Patent Application No. 2009-230767 (With English Translation).
Japanese Office Action dated Mar. 16, 2010, issued in Japanese Patent Application No. 2009-230778 (With English Translation).
Tobias Merkel et al., "A new technology for fluidic microsystems based on PCB technology"; Sensors and Actuators, vol. 77, issue Oct. 2, 1999, pp. 98-105.
U.S. Non-Final Office Action dated Nov. 26, 2008, issued in U.S. Appl. No. 10/505,416.
U.S. Non-Final Office Action dated Jun. 24, 2009, issued in U.S. Appl. No. 10/505,416.
U.S. Non-Final Office Action dated Dec. 3, 2009, issued in U.S. Appl. No. 12/496,212.
U.S. Final Office Action dated May 28, 2010, issued in U.S. Appl. No. 12/496,212.
U.S. Non-Final Office Action dated Oct. 22, 2009, issued in U.S. Appl. No. 12/501,056.
U.S. Final Office Action dated May 18, 2010, issued in U.S. Appl. No. 12/501,056.
U.S. Non-Final Office Action dated Oct. 22, 2009, issued in U.S. Appl. No. 12/501,097.
U.S. Final Office Action dated May 19, 2010, issued in U.S. Appl. No. 12/501,097.
U.S. Non-Final Office Action dated Nov. 25, 2009, issued in U.S. Appl. No. 12/501,108.
U.S. Final Office Action dated Jun. 4, 2010, issued in U.S. Appl. No. 12/501,108.
U.S. Non-Final Office Action dated Nov. 24, 2009, issued in U.S. Appl. No. 12/501,120.
U.S. Final Office Action dated Jun. 1, 2010, issued in U.S. Appl. No. 12/501,120.
U.S. Non-Final Office Action dated Mar. 17, 2010, issued in U.S. Appl. No. 12/502,394.
U.S. Non-Final Office Action dated Aug. 23, 2010, issued in U.S. Appl. No. 12/502,394.
U.S. Non-Final Office Action dated Jan. 26, 2009, issued in U.S. Appl. No. 10/598,086.
U.S. Final Office Action dated Feb. 4, 2010, issued in U.S. Appl. No. 10/598,086.
U.S. Non-Final Office Action dated Feb. 25, 2009, issued in U.S. Appl. No. 11/791,835.
U.S. Final Office Action dated Oct. 15, 2009, issued in U.S. Appl. No. 11/791,835.
U.S. Non-Final Office Action dated May 12, 2010, issued in U.S. Appl. No. 11/791,835.
U.S. Non-Final Office Action dated Jul. 22, 2010, issued in the U.S. Appl. No. 11/721,361.
Chinese Office Action dated Oct. 17, 2008, issued in corresponding Chinese Patent Application No. 200580042277X.
Chinese Office Action dated Jun. 1, 2010, issued in Chinese Patent Application No. 2008101499261 (with partial English translation).
International Search Report of PCT/JP2005/022656, date of mailing Mar. 7, 2006.
Japanese Office Action dated Jul. 28, 2009 (dispatch date), issued in corresponding Japanese Patent Application No. 2006-510632.
Japanese Office Action dated Oct. 27, 2009, issued in related Japanese Patent Application No. 2006-510632.
Japanese Office Action dated Jan. 5, 2010, issued in Japanese Patent Application No. 2006-547983.
Japanese Office Action dated Jun. 29, 2010 (mailing date), issued in corresponding Japanese Patent Application No. 2007-299538.
Japanese Office Action dated Jun. 29, 2010 (mailing date), issued in corresponding Japanese Patent Application No. 2006-254995.
Korean Office Action dated Nov. 26, 2008, issued in corresponding Korean Patent Application No. 10-2007-7013071.
Korean Office Action issued in related Korean Patent Application No. 10-2009-7025349 issued on Aug. 13, 2010 and English language translation.
Japanese Office Action dated Oct. 5, 2010, issued in related Japanese Patent Application No. 2006-546773.
Chinese Office Action dated Apr. 14, 2010, issued in corresponding Chinese Patent Application No. 2008-101499257.
Japanese Office Action dated Jul. 26, 2011 (dispatch date), issued in Japanese Patent Application No. 2009-223292.
Japanese Office Action dated Jul. 26, 2011 (dispatch date), issued in Japanese Patent Application No. 2010-021870.
Japanese Office Action dated Jul. 26, 2011 (dispatch date), issued in Japanese Patent Application No. 2010-021873.
Japanese Office Action dated Jul. 26, 2011 (dispatch date), issued in Japanese Patent Application No. 2010-021876.
Japanese Office Action dated Jul. 26, 2011 (mailing date), issued in corresponding Japanese Patent Application No. 2009-230797 with an English language translation.
U.S. Non-Final Office Action dated Jun. 13, 2011, issued in U.S. Appl. No. 12/496,212.
U.S. Non-Final Office Action dated Mar. 29, 2011, issued in U.S. Appl. No. 13/026,811.
U.S. Non-Final Office Action dated Dec. 22, 2010, issued in U.S. Appl. No. 12/501,108.
U.S. Non-Final Office Action dated Dec. 22, 2010, issued in U.S. Appl. No. 12/501,120.
U.S. Non-Final Office Action dated Jun. 24, 2010, issued in U.S. Appl. No. 10/598,086.
U.S. Final Office Action dated Apr. 18, 2011, issued in U.S. Appl. No. 10/598,086.
U.S. Final Office Action dated Nov. 26, 2010, issued in U.S. Appl. No. 11/791,835.
U.S. Non-Final Office Action dated Mar. 29, 2011, issued in U.S. Appl. No. 13/026,889.
U.S. Non-Final Office Action dated Apr. 15, 2011, issued in U.S. Appl. No. 13/026,875.
U.S. Final Office Action dated Aug. 18, 2011, issued in U.S. Appl. No. 13/026,875.
U.S. Non-Final Office Action dated Jun. 27, 2011, issued in U.S. Appl. No. 12/501,056.
U.S. Final Office Action dated Jul. 15, 2011, issued in U.S. Appl. No. 12/501,108.
U.S. Non-Final Office Action dated Jul. 19, 2011 issued in U.S. Appl. No. 12/501,120.
U.S. Final Office Action dated Nov. 12, 2010, issued in U.S. Appl. No. No. 11/721,361.
U.S. Non-Final Office Action dated Jul. 12, 2011 issued in U.S. Appl. No. 12/914,010.
Chinese Office Action dated Sep. 28, 2012, issued in corresponding Chinese Patent Application No. 201010574369.5, with English translation.
U.S. Final Office Action dated Nov. 26, 2012, issued in U.S. Appl. No. 11/791,835.
U.S. Final Office Action dated Nov. 26, 2012, issued in U.S. Appl. No. 13/087,878.
Chinese Office Action dated Dec. 9, 2011, issued in corresponding Application No. 2006101427349, with English Translation.

(56) References Cited

OTHER PUBLICATIONS

Chinese Office Action dated Dec. 8, 2011, issued in corresponding Application No. 2006101427334, with English Translation.
Chinese Office Action dated Dec. 16, 2011, issued in corresponding Application No. 2008101499223, with English Translation.
Extended European Search Report dated Jan. 2, 2013, issued in European Patent Application No. 05811638.5 (6 pages).
U.S. Final Office Action dated Feb. 7, 2013 issued in U.S. Appl. No. 12/914,010.
Japanese Office Action dated Jun. 12, 2012, issued in related Japanese Patent Application No. 2010-271950 (9 pages) with an English language translation.
U.S. Office Action dated Jul. 11, 2012, issued in related U.S. Appl. No. 12/501,120.
U. S. Non-Final Office Action dated Sep. 14, 2012, issued in U.S. Appl. No. 12/914,010.
Chinese Office Action dated Aug. 3, 2012 issued in corresponding Chinese patent application No. 200810149922.3, with English translation (5 pages).
U.S. Final Office Action dated Nov. 2, 2012, issued in corresponding U.S. Appl. No. 12/501,108.
U.S. Office Action dated Mar. 6, 2012, issued in corresponding U.S. Appl. No. 12/496,212.
U.S. Office Action dated Feb. 17, 2012, issued in corresponding U.S. Appl. No. 13/026,811.
U.S. Office Action dated Jan. 6, 2012, issued in corresponding U.S. Appl. No. 13/087,878.
U.S. Office Action dated Nov. 14, 2013, issued in U.S. Appl. No. 13/026,875.
U.S. Office Action dated Nov. 15, 2013, issued in U.S. Appl. No. 13/026,811.
U.S. Office Action dated Nov. 15, 2013, issued in U.S. Appl. No. 13/026,889.
U.S. Office Action dated Dec. 19, 2013, issued in U.S. Appl. No. 12/501,108.
U.S. Non-Final Office Action dated Jul. 11, 2013, issued in U.S. Appl. No. 12/501,120.
Chinese Office Action dated Apr. 17, 2013, issued in corresponding Chinese Patent Application No. 201010574369.5 with English Language Translation (7 pages).
U.S. Office Action dated Aug. 9, 2013, issued in related U.S. Appl. No. 12/496,212 (27 pages).
U.S. Office Action dated Aug. 7, 2013, issued in related U.S. Appl. No. 12/914,010 (14 pages).
U.S. Office Action dated Aug. 13, 2013, issued in related U.S. Appl. No. 12/501,056 (27 pages).
U.S. Office Action dated Feb. 14, 2014, issued in U.S. Appl. No. 12/496,212.
U.S. Office Action dated Mar. 12, 2014, issued in U.S. Appl. No. 12/501,108.
U.S. Notice of Allowance dated Aug. 4, 2014, issued in related U.S. Appl. No. 12/496,212 (22 pages).
Extended European Search Report dated Apr. 29, 2014, issued in counterpart European Patent Application No. 10177308.3 (7 pages).
Chinese Office Action dated May 6, 2014, issued in Chinese Patent Application No. 200810149922.3 with Partial English Translation (6 pages).
U.S. Non-Final Office Action dated Jun. 25, 2014, issued in related U.S. Appl. No. 10/598,086 (95 pages).

\* cited by examiner

MICRO FLUID SYSTEM SUPPORT AND MANUFACTURING METHOD THEREOF

This application is a divisional of U.S. application Ser. No. 10/505,416, filed on Jun. 13, 2005, pending, which is a National Stage of International Application No. PCT/JP2003/02066, filed on Feb. 25, 2003.

BACKGROUND OF THE INVENTION

1. Field of the Invention

The present invention relates to a support unit for a microfluidic system, in which a hollow filament is laid on and fixed to a support to have a predetermined shape, and a manufacturing method thereof.

2. Description of the Related Art

In chemical and biochemical fields, studies have advanced to miniaturization of reaction systems and analyzers that use microelectromechanical systems (MEMS). In conventional research and development, there is a micron-scale machine element (referred to as "micromachine" hereinafter) having a single function as a micromotor or micropump.

In order to conduct an intended chemical reaction or chemical analysis, it is necessary to combine a plurality of various micromachine parts together and systemize them. A complete form of such system is referred to by such names as micro reactor system, or micro total analysis system (μTAS). Usually, micromachines are formed on a silicon chip by applying a semiconductor manufacturing process. In principle, it is possible to form (integrate) a plurality of elements on one chip systemizing them, and efforts have been made in fact toward this operation. However, the fabrication process of the system is complicated, and it is assumed difficult to manufacture the system at a mass production level. A chip substrate (referred to as nanoreactor hereinafter), where a groove is formed as a flow channel by etching or the like at a predetermined position in a silicon substrate, has been suggested as a method of connecting a plurality of micromachines to form a fluidic circuit (system). This method has an advantage in that manufacturing of the system is far easier than manufacturing of the system in the aforementioned method of integration. However, a cross-sectional area of the flow channel is small, and interface resistance between a fluid and the side surface of the groove is large. Thus, under the present circumstances, the maximum length of the flow channel is not more than millimeters, and, in synthetic reactions and chemical reactions that are actually conducted, the number of steps and the amount of a fluid for reaction and analysis are limited.

However, the fabrication process of the system is complicated, and it is assumed difficult to manufacture the system at a mass production level. Therefore, in recent years, a chip substrate, where a groove is formed as a flow channel by etching or the like at a predetermined position in a silicon substrate, has been suggested as a method of connecting a plurality of micromachines to form a fluidic circuit. This method has an advantage in that manufacturing of the system is far easier than manufacturing of the system in the aforementioned method of integration. However, on the other hand, this method has a problem in that a cross-sectional area of the flow channel is small, and interface resistance between a fluid and the side surface of the groove is large. Thus, under the present circumstances, the maximum length of the flow channel is not more than millimeters, and, in synthetic reactions and chemical reactions that are actually conducted, the number of steps and the amount of a fluid for reaction and analysis are limited.

SUMMARY OF THE INVENTION

The present invention was accomplished to resolve the above-described problem. In other words, an object of the present invention is to provide a support unit for a microfluidic system, which is manufactured easily and has a long flow channel in centimeters that does not limit the number of steps and an amount of a fluid for reaction and analysis.

Another object of the present invention is to provide a support unit for a small microfluidic system, which does not require space even with a complicated fluidic circuit.

Yet another object of the present invention is to provide a manufacturing method for a support unit for a microfluidic system, in which a complicated fluidic circuit can be formed.

In order to achieve the above object, a first aspect of the present invention inheres in a support unit for a microfluidic system including (a) a first support, (b) a first adhesive layer provided on a surface of the first support, (c) a hollow filament laid on a surface of the first adhesive layer to have an arbitrary shape, and (d) a hollow filament laid on the surface of the first adhesive layer to have an arbitrary shape and functioning as a flow channel layer of a microfluidic system. In the first aspect of the present invention, another hollow filament can be three-dimensionally laid in a manner of intersecting with said hollow filament. Therefore, it becomes possible to provide a support unit for a microfluidic system which has good accuracy, can be manufactured easily and has a long flow channel in centimeters that does not limit the number of steps and the amount of a fluid for reaction and analysis. Further, according to the first aspect of the present invention, it is possible to provide a support unit for a small microfluidic system, which does not require space even with a complicated fluidic circuit. Thus, it is also possible to downsize the microfluidic system itself.

A second aspect of the present invention inheres in a support unit for a microfluidic system including (a) a first support, (b) a first adhesive layer provided on a surface of the first support, and (c) a first hollow filament group constituted by a plurality of hollow filaments laid on a surface of the first adhesive layer to have an arbitral shape and respectively functioning as a plurality of flow channel layers of the microfluidic system. In the second aspect of the present invention, a second hollow filament group constituted by a plurality of hollow filaments can be three-dimensionally laid to intersect the first hollow filament group constituted by the plurality of hollow filaments. Therefore, it becomes possible to provide a support unit for a microfluidic system which has good accuracy, can be manufactured easily and has a long flow channel in centimeters that does not limit the number of steps and the amount of a fluid for reaction and analysis. Further, according to the first aspect of the present invention, it is possible to provide a support unit for a small microfluidic system, which does not require space even with a complicated fluidic circuit. Thus, it is also possible to downsize the microfluidic system itself.

A third aspect of the present invention inheres in a manufacturing method of a support unit for a microfluidic system including (a) forming a first adhesive layer on a surface of a first support, and (b) laying a hollow filament on a surface of the first adhesive layer. The manufacturing method of a support unit for a microfluidic system according to the third aspect of the present invention is a manufacturing method using the support unit for a microfluidic system explained in the first aspect. According to the third aspect of the present invention, it is possible to provide a manufacturing method of a support unit for a small microfluidic system in which a complicated fluidic circuit can be formed.

A fourth aspect of the present invention inheres in a manufacturing method of a support unit for a microfluidic system including (a) forming a first adhesive layer on a surface of a first support, and (b) laying a first hollow filament group constituted by a plurality of hollow filaments on a surface of the first adhesive layer. The manufacturing method of a support unit for a microfluidic system according to the fourth aspect of the present invention is a manufacturing method using the support unit for a microfluidic system described in the second aspect. According to the fourth aspect of the present invention, it is possible to provide a manufacturing method of a support unit for a small microfluidic system in which a complicated fluidic circuit can be formed.

DETAILED DESCRIPTION OF THE INVENTION

Embodiments of the present invention are described with reference to the drawings. The same or similar parts are denoted by the same or similar symbols. However, the drawings are schematic, and a relation between a thickness and a dimension of a plane, a ratio between thicknesses of respective layers, and the like are different from those in reality. Therefore, specific thicknesses and dimensions should be determined by checking the description below. In addition, between the drawings, relationship and ratio between dimensions may of course be different.

First Embodiment (Support Unit for Microfluidic System)

Figure 1A:
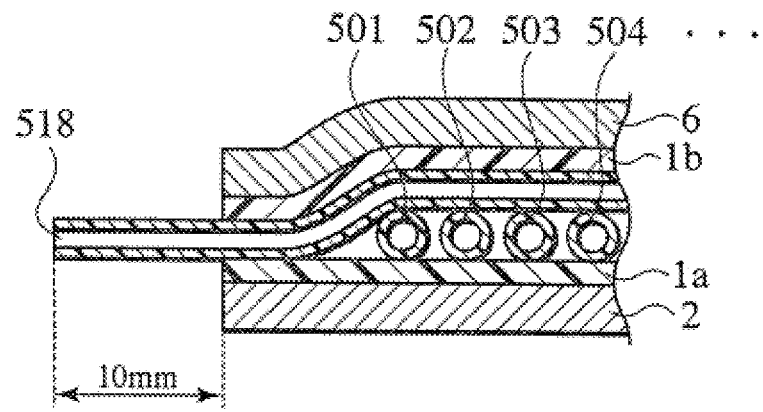
FIG. 1 is a cross sectional view of a support unit for a microfluidic system according to a first embodiment of the present invention.
FIG. 1B is a plan view whose cross section along the line $I_A$-$I_A$ viewed in the arrow direction corresponds to FIG. 1A.
Figure 1B:
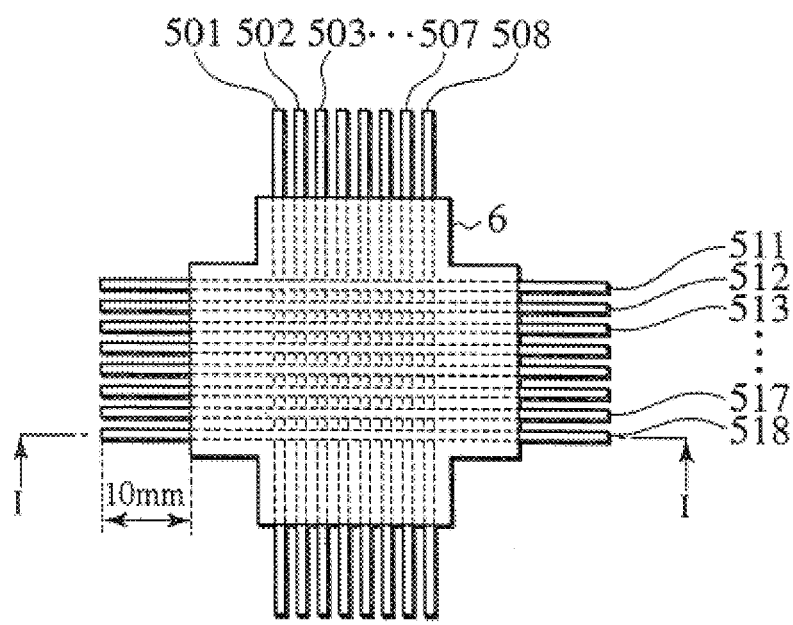

As shown in FIGS. 1A and 1B, a support unit for a microfluidic system according to a first embodiment of the present invention includes a first support 2, a first adhesive layer 1a provided on a surface of the first support 2, a first hollow filament group constituted by a plurality of hollow filaments 501, 502, 503, . . . , 508 laid on a surface of the first adhesive layer to have an arbitrary shape, a second hollow filament group constituted by a plurality of hollow filaments 511, 512, 513, . . . , 518 laid in a direction intersecting with the first hollow filament group, a second adhesive layer 1b provided on a surface of the second hollow filament group, and a second support 6 provided on a surface of the second adhesive layer 1b. The first hollow filament group constituted by the plurality of hollow filaments 501, 502, 503, . . . , 508 and the second hollow filament group constituted by the plurality of hollow filaments 511, 512, 513, 518 respectively configure flow channel layers for a chemical solution, in the support unit for a microfluidic system according to the first embodiment of the present invention.

Figure 9A:
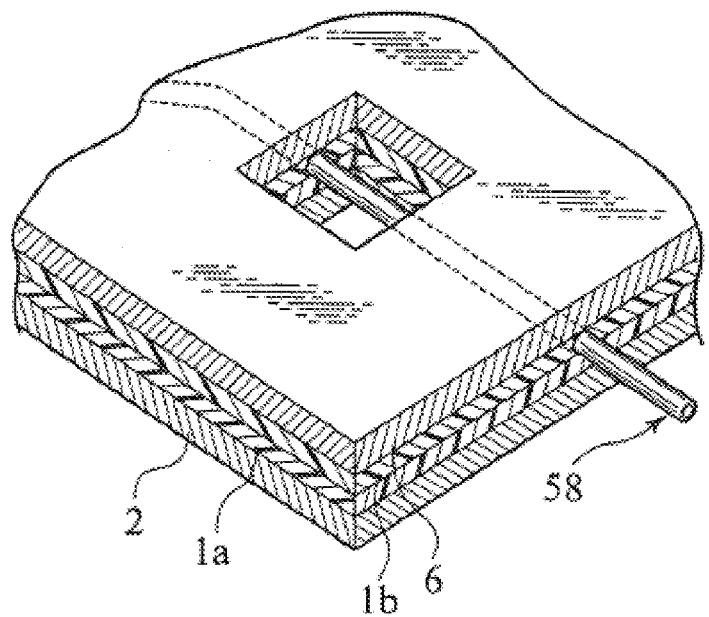
FIG. 9A is a bird's eye view (No. 1) explaining a configuration of a hollow filament for a support unit for a microfluidic system according to another embodiment of the present invention.

The inner diameters and outer diameters of the plurality of hollow filaments 501 to 508 and 511 to 518 may be selected depending on a purpose. However, the inner diameters preferably range from about $\phi$0.05 mm to $\phi$0.5 mm since milliliters (mL) to microliters (μL) of fluid is flown therethrough. In fabricating the hollow filaments 501 to 508 and 511 to 518 with the above diameters, particularly suitable materials for the hollow filaments are polyimide (PI), polyether ether ketone (PEEK), polyether imide (PEI), polyphenylene sulfide (PPS), tetrafluoroethylene-perfluoroalkoxyethylene copolymer (PFA), and the like. With inner diameters of $\phi$0.05 mm or smaller, an influence of the interface resistance between the fluid and the inner wall surfaces of the hollow filaments 501 to 508 and 511 to 518 becomes too great to be ignored. On the other hand, with inner diameters larger than ϕ0.5 mm, high pressure is required to allow the fluid to flow continuously, thus causing an increase in burdens on other parts and mixing of air bubbles into the fluid. When causing a chemical reaction in the fluid flowing through the first hollow filament group constituted by the plurality of hollow filaments 501 to 508 and the second hollow filament group constituted by the plurality of hollow filaments 511 to 518, it is preferred that the hollow filaments 501 to 508 and 511 to 518 be chemical resistant. Further, when causing a photochemical reaction or performing spectroscopic analysis by illuminating the fluid flowing through the hollow filaments 501 to 508 and 511 to 518, it is preferred that the hollow filaments 501 to 508 and 511 to 518 be transparent. A value of light transmittance may depend on purpose, but the value is preferably 80% or more with a target wavelength, and the value of 90% or more is optimal. In other words, as shown in FIG. 9A, it is preferred that the second support 6, the second adhesive layer 1b, and a hollow filament 58 be transparent at a predetermined position, or that the hollow filament 58 be exposed and at least the exposed portion of the hollow filament 58 be transparent.

In comparison with a free state, fixing the hollow filaments 501 to 508 and 511 to 518 to the first support 2 produces an excellent advantage in that various environments around the hollow filaments such as temperature, an electric field, and a magnetic field can be easily controlled. This is advantageous in performing a chemical reaction or chemical analysis, and is particularly essential for micronized reaction system and analysis system. There is another advantage in that the hollow filaments 501 to 508 and 511 to 518 are easily aligned with and connected to parts, and a number of the hollow filaments 501 to 508 and 511 to 518 can be accommodated compactly.

Further, when performing chemical analysis, providing the plurality of hollow filaments 501 to 508 and 511 to 518 is advantageous in that operation efficiency is improved. In this case, it is required that the lengths of the plurality of hollow filaments 501 to 508 constituting the first hollow filament group are equal to each other from a viewpoint that, when the analysis starts simultaneously in the hollow filaments, results of the analysis should be obtained almost simultaneously. Similarly, it is required that the lengths of the plurality of hollow filaments 511 to 518 constituting the second hollow filament group are equal to each other. In other words, it is important that amounts of energy applied from the outside to the inlets through the outlets for a sample are uniform, and that there is little difference between the amounts of energy applied to the hollow filaments. From this viewpoint, it is preferred that the hollow filaments 501 to 508 and 511 to 518 be sandwiched by at least two supports so that distribution of heat conducted through the hollow filaments 501 to 508 and 511 to 518 is uniform.

Moreover, it is preferred that the plurality of hollow filaments 501 to 508 constituting the first hollow filament group and the plurality of hollow filaments 511 to 518 constituting the second hollow filament group be arrayed at mutually equal intervals. Furthermore, it is preferred that the plurality of hollow filaments 501 to 508 constituting the first hollow filament group and the plurality of hollow filaments 511 to 518 constituting the second hollow filament group have a uniform tube thickness.

Commercially available tubes made from various materials can be used for the plurality of hollow filaments 501 to 508 and 511 to 518, and tubes made of an arbitrary material may be selected depending on a purpose. These materials include, for example, an organic material such as polyvinyl chloride resin (PVC), polyvinylidene chloride resin, polyvinyl acetate resin, polyvinyl alcohol resin (PVA), polystyrene resin (PS), acrylonitrile butadiene styrene copolymer (ABS), polyethylene resin (PE), ethylene-vinyl acetate copolymer (EVA), polypropylene resin (PP), poly-4-methylpentene (TPX), polymethyl methacrylate (PMMA), PEEK, PI, PEI, PPS, cellulose acetate, polytetrafluoroethylene resin (PTFE), tetrafluoroethylene-hexafluoropropylene resin (FEP), PFA, polyethylene-tetrafluoroethylene copolymer (ETFE), polychlorotrifluoro-ethylene (PCTFE), polyvinylidene fluoride (PVDF), polyethylene terephthalate resin (PET), polyamide resin (nylon), polyacetal (POM), polyphenylene terephthalate (PPT), polycarbonate resin (PC), polyurethane resin, polyesterelastomer, polyolefin resin, silicone resin, and polyimide resin, and an inorganic material such as glass, quartz, and carbon.

Material type, shape and size of the first support 2 may be selected depending on a purpose. An appropriate range of the board thickness or film thickness of the first support 2 is differentiated depending on a purpose or a required function. For example, where electrical insulation properties are required in the first support 2, selected is an epoxy resin board or a polyimide resin board used for a printed wiring board, a polyimide film represented by Kapton film by DuPont Corporation used for a flexible printed wiring board, or a PET film represented by Lumirror Film by Toray Industries Inc. It is preferred that the first support 2 have a large board thickness (film thickness), and the thickness of 0.05 mm or larger is particularly preferred. Moreover, where heat dissipation properties are required in the first support 2, a metal board such as an aluminum (Al) board, a copper (Cu) board, a stainless steel board, and a titanium (Ti) board is selected. It is preferred that the thickness of the first support 2 is even thicker, and the thickness of 0.5 mm or larger is particularly preferred. Further, where light transmittivity is required in the first support 2, selected is a board made of a transparent inorganic material such as glass and quartz, or a board or film made of a transparent organic material such as polycarbonate and acryl. It is preferred that the first support 2 has a small board thickness (film thickness), and a thickness of 0.5 mm or smaller is particularly preferred. It is also possible to use so-termed flexible circuit board or printed circuit board in which a metal pattern such as a copper pattern is formed on the surface of the first support 2 by etching or plating. In virtue of this, it becomes possible to form a terminal or a circuit which implements various parts and elements such as a micromachine, a heater element, a piezoelectric element, various sensors including those of temperature, pressure, distortion, vibration, voltage, magnetic field, and the like, an electronic part such as a resistor, a capacitor, a coil, a transistor, and an IC, and an optical part such as a laser diode (LD), a light emitting diode (LED) and a photodiode (PD). Thus, systemization becomes easy.

The first adhesive layer 1a formed on the surface of the first support 2 is preferably a pressure sensitive or photosensitive adhesive. These materials realize stickiness or adhesion by application of pressure or light thereto. Therefore, these materials are suitable for the case where the hollow filaments (hollow capillaries) are mechanically laid. As for the pressure sensitive adhesive, a high-molecular weight synthetic rubber adhesive or a silicone resin adhesive is appropriate. The high-molecular weight synthetic rubber may be, for example, polyisobutylene such as Vistanex MML-120 by Tonex Co., Ltd., acrylonitrile-butadiene rubber such as Nipol N1432 by Zeon Corporation, chlorosulfonated polyethylene such as Hypalon 20 by DuPont Corporation, and the like. In this case, the first adhesive layer 1a can be formed in a manner that these materials are dissolved into a solvent, applied directly onto the first support 2 and dried. Further, a crosslinking agent may be compounded in these materials as necessary. It is also possible to use a pressure sensitive adhesive double coated tape made of acrylic resin, such as No. 500 by Nitto Denko Corporation, A-10, A-20, A-30 or the like by 3M Corporation, and the like. As for the silicone resin adhesive, a suitable adhesive is a silicone rubber made from high-molecular weight polydimethylsiloxane or polymethylphenylsiloxane and containing terminal silanol groups, or a silicone adhesive whose main ingredient is a silicone resin like a methyl silicone resin or a methylphenyl silicone resin. Various crosslinking can be performed in order to control cohesive strength. For example, crosslinking can be performed by an addition reaction of silane, a condensation reaction of alkoxy, a condensation reaction of acetoxy, and a radical reaction by peroxide or the like. Commercially available adhesives of the above kind include YR3286 (product name, produced by GE Toshiba Silicones Co., Ltd.), TSR1521 (product name, produced by GE Toshiba Silicones Co., Ltd.), DKQ9-9009 (product name, produced by Dow Corning Corporation) and the like. As for the photosensitive adhesive, for example, a dry film resist used as an etching resist of a printed circuit board, a solder resist ink, a photosensitive buildup material of a printed circuit board can be employed. Specifically, H-K440 by Hitachi Chemical Co., Ltd., Probimer by Ciba-Geigy Corporation or the like can be used. Particularly, a photovia material provided for use in a buildup wiring board is durable to a manufacturing process of a printed wiring board and to a process of mounting parts by soldering. Any kind of material can be used as such material as long as it is a copolymer containing functional groups which can be crosslinked by light, or a composition containing monomer, and/or a composition obtained by mixing functional groups which can be crosslinked by heat in stead of light and a thermal polymerization initiator.

The first adhesive layer 1a may be epoxy resin, brominated epoxy resin, cycloaliphatic epoxy resin such as rubber-modified epoxy resin and rubber-dispersed epoxy resin, or bisphenol A epoxy resin and acid modifications of these epoxy resins. Particularly, when photo-curing is performed by illumination, modifications made of these epoxy resins and unsaturated acid are preferred. Unsaturated acid may include maleic anhydride, tetrahydrophthalic anhydride, itaconic acid anhydride, acrylic acid, methacrylic acid, and the like. These modifications are obtained by reacting unsaturated carboxylic acid with epoxy groups of epoxy resin with a compounding ratio in which an amount of unsaturated carboxylic acid is equal to or less than epoxy groups. Apart from the above, a thermosetting material such as melamine resin and cyanate ester resin, or a combination of such thermosetting material and phenolic resin is also a part of favorable application examples. In addition, a combination of such resin and a material which adds flexibility is also favorable. Examples of this include acrylonitrile-butadiene rubber, natural rubber, acrylic rubber, SBR, carboxylic acid-modified acrylonitrile-butadiene rubber, carboxylic acid-modified acrylic rubber, crosslinking NBR particles, carboxylic acid-modified crosslinking NBR particles and the like. By adding various resin components, a curing material can be provided with various properties while maintaining basic properties such as photo-curing and thermosetting. For example, a combination with epoxy resin or phenolic resin can add good electrical insulating properties to a curing material. When a rubber component is compounded, a curing material is provided with toughness, and, at the same time, the surface of the curing material can be roughened easily by surface treatment using an oxidizing chemical solution. Further, additives (polymerization stabilizer, leveling agent, pigment, dye and the like), which are commonly used, may also be added. It is perfectly acceptable to compound a filler. The filler may include inorganic microparticles such as silica, fused silica, talc, alumina, hydrated alumina, barium sulfate, calcium hydroxide, aerosol, and calcium carbonate, organic microparticles such as powdered epoxy resin and powdered polyimide particles, and powdered polytetrafluoroethylene particles. These fillers may be subjected to coupling treatment in advance. Dispersion of these fillers can be achieved by a known mixing method such as a kneader, a ball mill, a bead mill, and a triple-roll mill. A method of forming a photosensitive resin of this kind may be a coating method such as a roll coating, curtain coating and dip coating, and a method of producing films of an insulating resin on a carrier film and sticking the films together by a laminator. Specifically, a photo-via film BF-8000 by Hitachi Chemical Co., Ltd. or the like can be used.

Earlier-described various materials for the first support 2 can be used for the second support 6. Further, the second adhesive layer 1b is inserted between the second support 6 and the second hollow filament group constituted by the plurality of hollow filaments 511 to 518. This is preferable since the first hollow filament group constituted by the plurality of hollow filaments 501 to 508 and the second hollow filament group constituted by the plurality of hollow filaments 511 to 518 are provided with increased protection. By selecting a mesh-like film or a porous film as the second support 6, a problem such as trapped air bubbles when laminating becomes difficult. This mesh-like film or a fabric may be a polyester mesh TB-70 by Tokyo Screen Co., Ltd. The porous film may be Duragard by Celanese Chemicals, Ltd., Celgard 2400 by Daicel Chemical Industries, Ltd., for example.

The earlier-described various materials for the first adhesive layer 1a can be used for the second adhesive layer 1b.

(Manufacturing Method of Support Unit for Microfluidic System)

Next, a manufacturing method of the support unit for a microfluidic system according to the first embodiment of the present invention is described using FIGS. 2 to 8.

Figure 2:
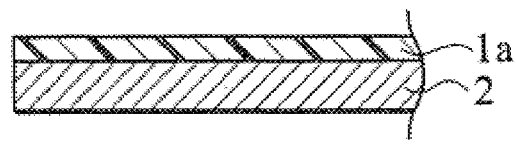
FIG. 2 is a process cross sectional view (No. 1) explaining a manufacturing method of the support unit for a microfluidic system according to the first embodiment of the present invention.
Figure 3A:
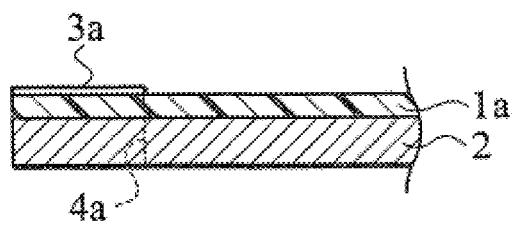
FIG. 3A is a process cross sectional view (No. 2) explaining the manufacturing method of the support unit for a microfluidic system according to the first embodiment of the present invention.
Figure 3B:
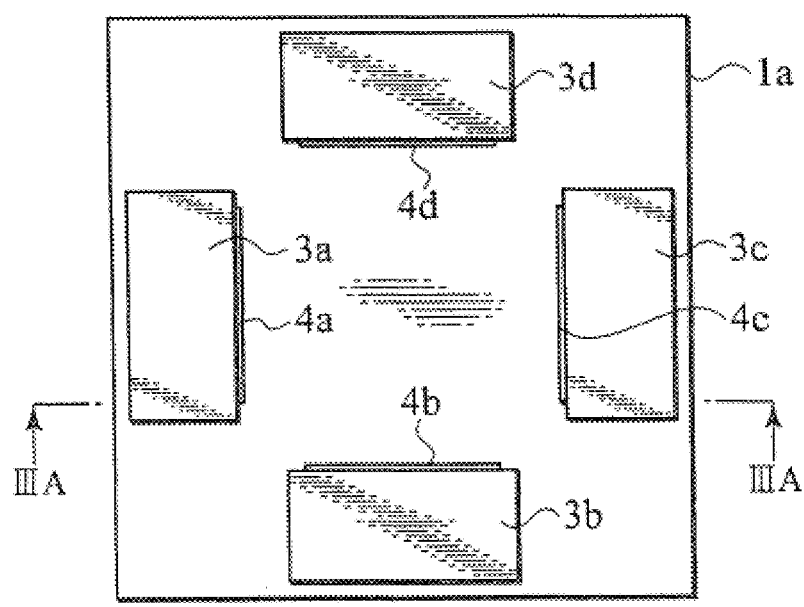
FIG. 3B is a plan view whose cross section along the line MA-MA viewed in the arrow direction corresponds to FIG. 3A.

(a) First of all, as shown in FIG. 2, the first adhesive layer 1a is formed on the surface of the first support 2 to have the same shape and approximately the same size as the first support 2. Then, as shown in FIGS. 3A and 3B, four rectangle release layers 3a, 3b, 3c, and 3d are equally formed on the peripheral portions of the surface of the first adhesive layer 1a. These release layers 3a, 3b, 3c and 3d are formed on the surface of the first adhesive layer 1a by a method of applying a commercially available release agent or sticking release-films to predetermined portions of the surface of the first adhesive layer 1a. Next, slits 4a, 4b, 4c and 4d are provided in the first support 2 by a cutter or the like. For example, the slits are made at positions adjacent to the inner lines of the respective four release layers 3a, 3b, 3c and 3d.

Figure 4A:
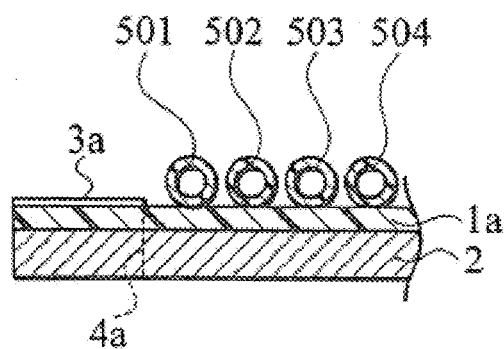
FIG. 4A is a process cross sectional view (No. 3) explaining the manufacturing method of the support unit for a microfluidic system according to the first embodiment of the present invention.
Figure 4B:
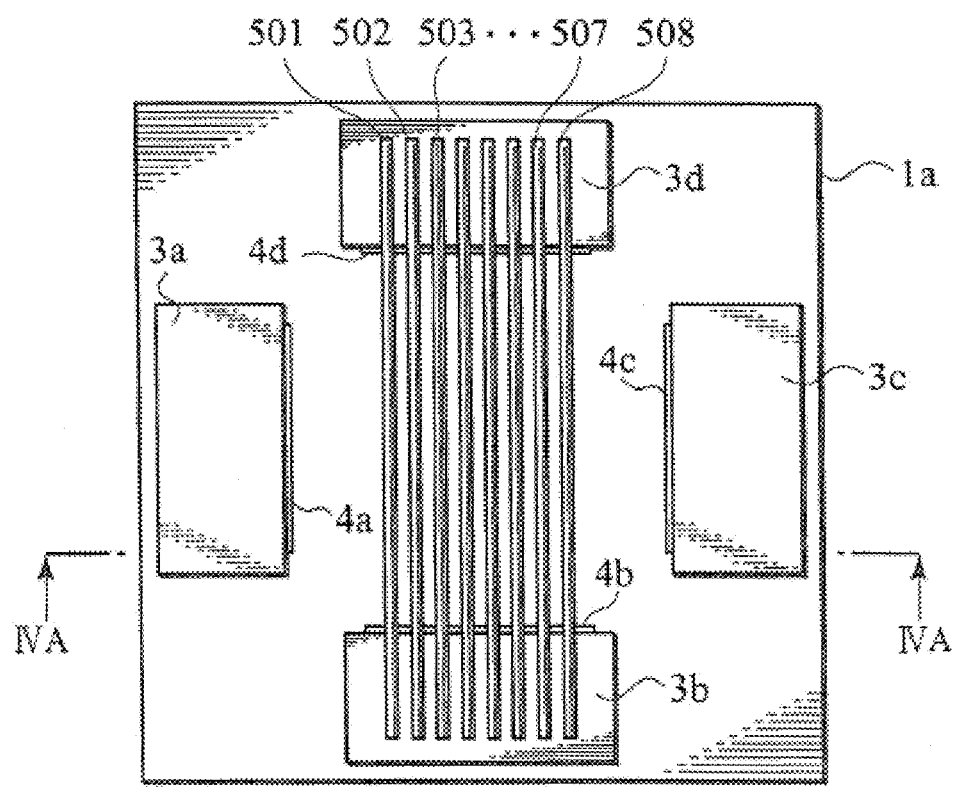
FIG. 4B is a plan view whose cross section along the line $IV_A$-$IV_A$ viewed in the arrow direction corresponds to FIG. 4A.
Figure 5A:
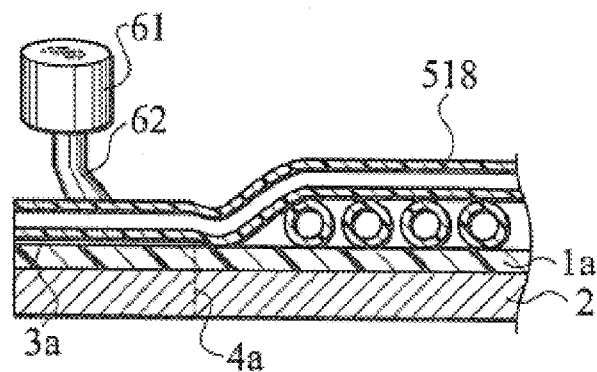
FIG. 5A is a process cross sectional view (No. 4) explaining the manufacturing method of the support unit for a microfluidic system according to the first embodiment of the present invention.

(b) Next, as shown in FIGS. 4A and 4B, the first hollow filament group constituted by the plurality of hollow filaments 501 to 508 is laid in a vertical direction from the release layer 3b towards the release layer 3d, on the surface of the first support 2 on which the first adhesive layer 1a is formed. Although not illustrated, an NC wiring machine 61 similar to that shown in FIG. 5A is used when laying the first hollow filament group. (There is a wiring machine disclosed in Japanese Patent Laid-Open Publication (Kokai) No. 2001-59910 as such a wiring machine. Further, a machine disclosed in Japanese Examined Patent Publication (Kokoku) No. Showa 50 (1975)-9346 can apply a load and ultrasonic vibration while wiring. Furthermore, a machine disclosed in Japanese Examined Patent Publication (Kokoku) No. Heisei 7 (1995)-95622 is capable of applying a load and emitting a laser beam.) The NC wiring machine 61 is numerically controlled and is capable of controlling outputs of ultrasonic vibration and a load. By using this NC wiring machine 61, a laid pattern of the first hollow filament group constituted by the plurality of hollow filaments 501 to 508 can be precisely controlled. Specifically, the NC wiring machine 61 applies a load and vibration by an ultrasonic wave to the first hollow filament group constituted by the hollow filaments 501 to 508, while moving in parallel with the first support 2.

Figure 5B:
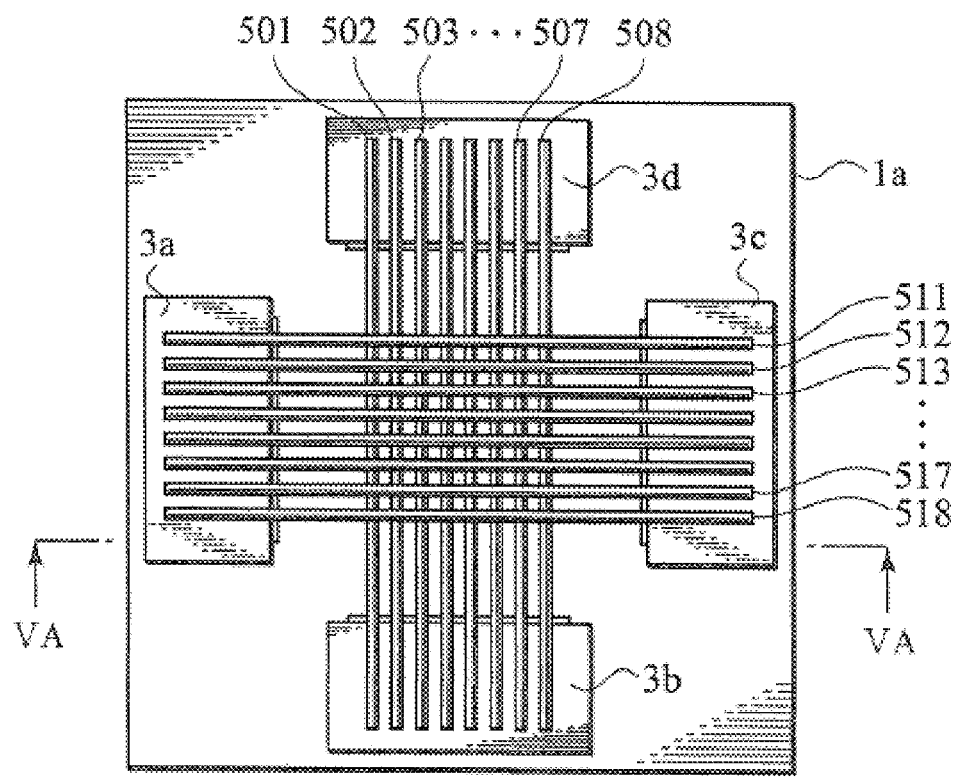
FIG. 5B is a plan view whose cross section along the line $V_A$-$V_A$ viewed in the arrow direction corresponds to FIG. 5A.

(c) Next, as shown in FIGS. 5A and 5B, the second hollow filament group constituted by the plurality of hollow filaments 511 to 518 is laid in a direction from the release layer 3*a* towards the release layer 3*c* intersecting with the first hollow filament group constituted by the plurality of hollow filaments 501 to 508 which has already been laid. As shown in FIG. 5A, the NC wiring machine 61 is used when laying the second hollow filament group. Thus, a laid pattern of the second hollow filament group constituted by the plurality of hollow filaments 511 to 518 can be controlled precisely. Specifically, the NC wiring machine 61 applies a load and vibration by an ultrasonic wave to the second hollow filament group constituted by the plurality of hollow filaments 511 to 518, while moving in parallel with the first support 2. However, the NC wiring machine 61 is set to stop a load and ultrasonic vibration at the position where the first hollow filament group constituted by the hollow filaments 501 to 508 and the second hollow filament group constituted by the hollow filaments 511 to 518 intersect with each other. By stopping a load and/or ultrasonic vibration near the intersection of the first hollow filament group and the second hollow filament group, stress on the hollow filaments 501 to 508 and 511 to 518 is reduced, and breakage of the hollow filaments 501 to 508 and 511 to 518 can be prevented.

Figure 6A:
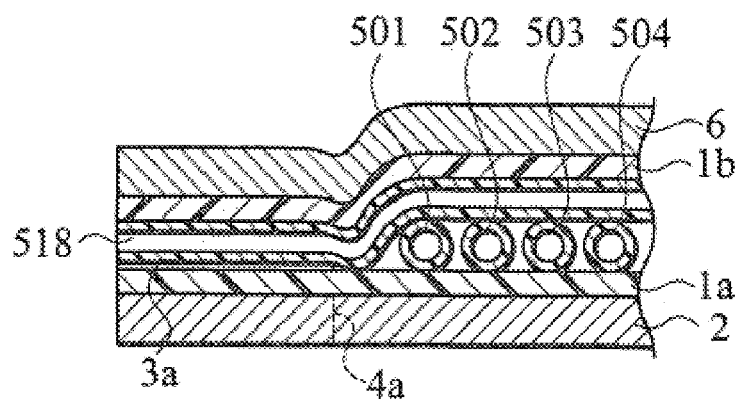
FIG. 6A is a process cross sectional view (No. 5) explaining the manufacturing method of the support unit for a microfluidic system according to the first embodiment of the present invention.
Figure 6B:
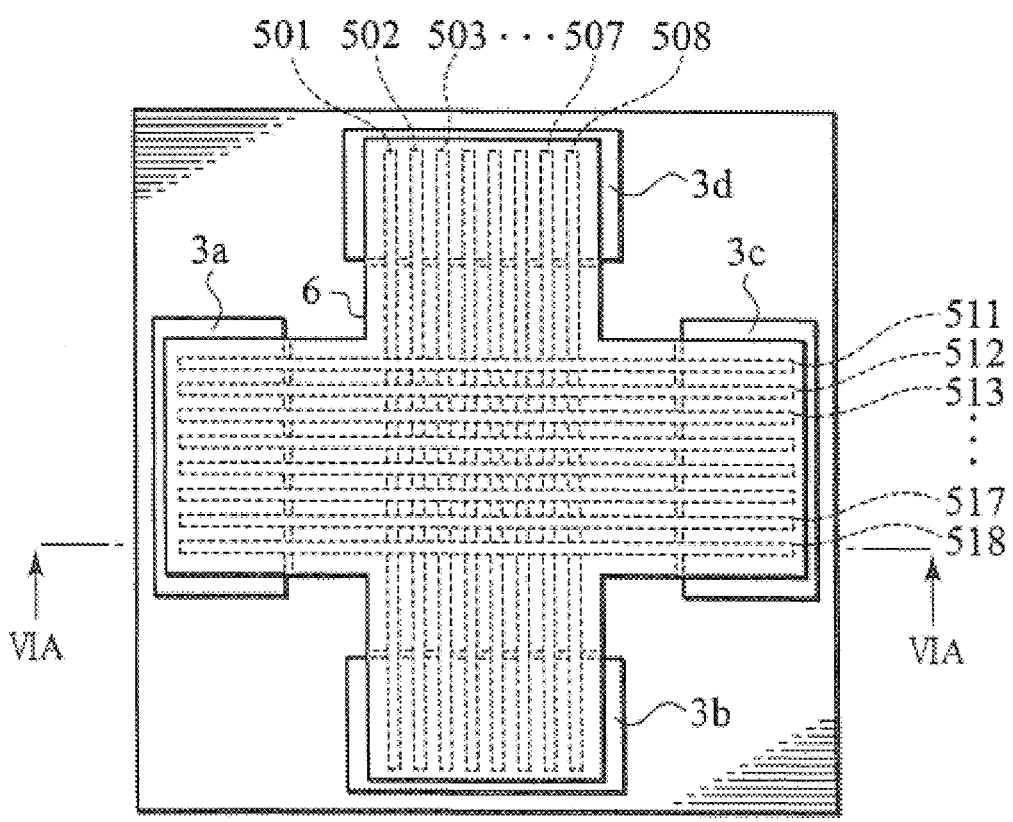
FIG. 6B is a plan view whose cross section along the line $VI_A$-$VI_A$ viewed in the arrow direction corresponds to FIG. 6A.

(d) Next, as shown in FIGS. 6A and 6B, the second adhesive layer 1*b* having the same shape and almost the same size as the first support 2 is formed so as to cover the first hollow filament group constituted by the plurality of hollow filaments 501 to 508 and the second hollow filament group constituted by the plurality of hollow filaments 511 to 518, which have already been laid. Further, the second support 6 having the same shape and size as the first support 2 is prepared and adhered (laminated) onto the second adhesive layer 1*b*. Various methods are considered for laminating the second support 6. Where the second support 6 is a mesh-like film or a porous film, this protection film can be closely adhered to the second adhesive layer 1*b* without air trapped in the interface, by applying a little pressure. However, where the second support 6 is a uniform film, there is no way to avoid air bubbles remaining in the interface. In this case, pressing the film with high pressure may be considered, but a large force is applied onto the hollow filaments 501 to 508 and 511 to 518 and the hollow portions of the filaments are deformed. Further, there is a problem in that, for example, a large force is locally applied onto the intersection between the first hollow filament group and the second hollow filament group, and the filaments at the intersection are broken. In such a case, it is preferred to use a vacuum laminating machine to create a vacuum state before the second support 6 is closely adhered to the second adhesive layer 1*b* and, thereafter, to press and bond the second support 6 to the second adhesive layer 1*b* at low pressure. This is because there will be no air trapped in the interface, and a large stress does not remain in the hollow filaments 501 to 508 and 511 to 518, causing no breakage of the hollow filaments.

Figure 7A:
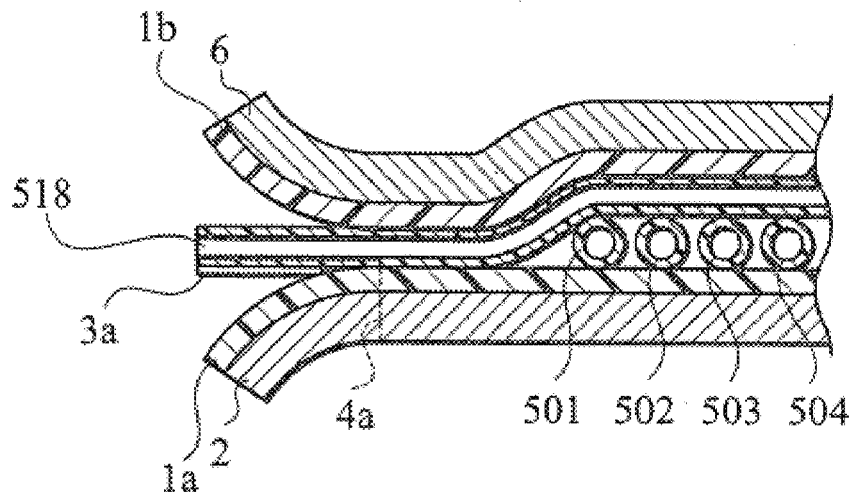
FIG. 7A is a process cross sectional view (No. 6) explaining the manufacturing method of the support unit for a microfluidic system according to the first embodiment of the present invention.
Figure 7B:
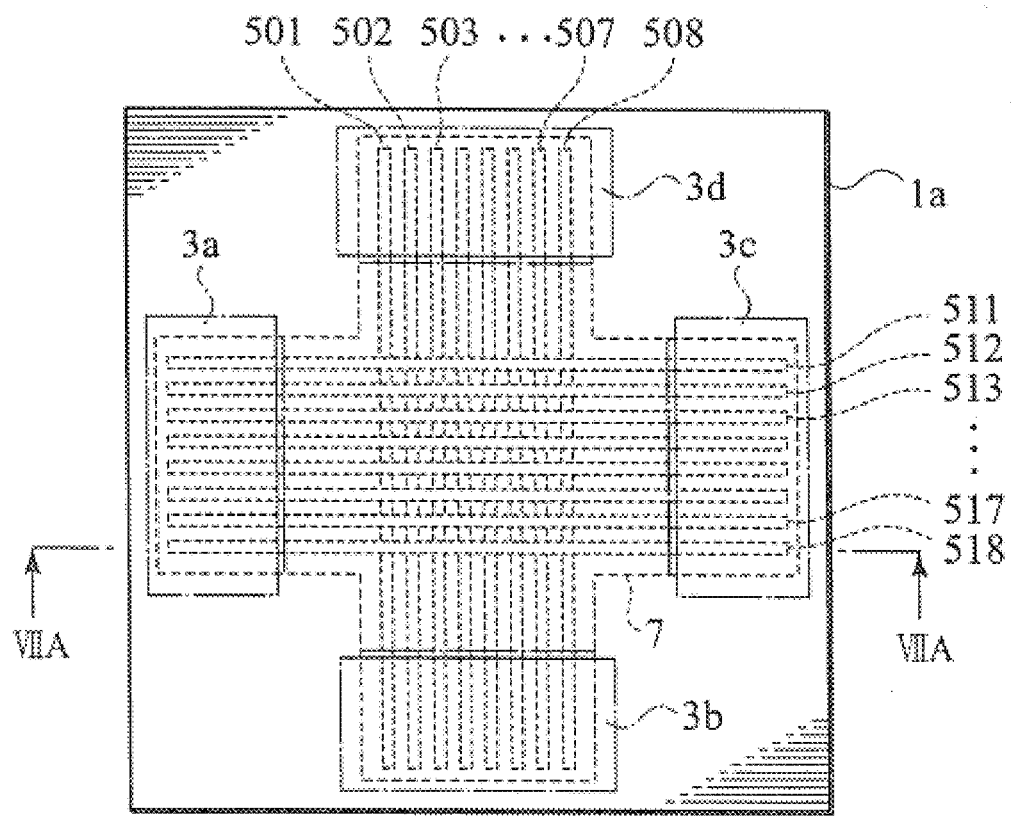
FIG. 7B is a plan view whose cross section along the line $VII_A$-$VII_A$ viewed in the arrow direction corresponds to FIG. 7A.

(e) Thereafter, the support unit is cut along a cutting line 7 in a desired shape shown by a dotted line in FIG. 7B. A method of making the support unit for a microfluidic system into the desired shape is cutting the support unit by a cutter or cutting the same by pressing a metal blade fabricated to have the desired shape in advance. However, automation of cutting with a cutter is difficult, and, as for the blade, fabrication of jigs takes time and effort. Therefore, it is preferred to use an NC driven laser beam machine as it only requires data preparation to operate. Further, with regard to the laser beam machine, it is preferred to use a laser beam driller for drilling small diameter holes in a printed circuit board rather than a machine with a large output designated for cutting. The laser beam driller for a printed circuit board is preferred since it has a large energy output per unit period, drills a hole by a plurality of shots at the same position, and moves by a measure of about half the diameter of the hole, thus causing the very small number of laser scorches. As shown in FIG. 7B, the support unit is cut along a cutting line 7 set so as to overlap positions 4*a* where the slits 4*a*, 4*b*, 4*c* and 4*d* are made in advance. As shown in FIG. 7A, by making the slits 4*a*, 4*b*, 4*c* and 4*d* in advance, the first adhesive layer 1*a* and the second adhesive layer 1*b* are automatically peeled off near the end of the hollow filament 518. Although not illustrated, at the ends of the other hollow filaments 501 to 508, 511, 512, 513, . . . , 517, the first adhesive layer 1*a* and the second adhesive layer 1*b* are similarly peeled off automatically. The first hollow filament group constituted by the plurality of hollow filaments 501 to 508 and the second hollow filament group constituted by the plurality of hollow filaments 511 to 518 are laid on the first adhesive layer 1*a*. Thereafter, the second support 6 is adhered to the hollow filaments through the second adhesive layer 1*b*. With this construction, a process of exposing the ends of the plurality of hollow filaments 501 to 508 and 511 to 518 becomes complicated. Therefore, the slits 4*a*, 4*b*, 4*c* and 4*d* are provided in advance at the boundary lines between the portions which are unnecessary and removed ultimately and the portion to remain as the first support 2, thus facilitating the process of exposing the ends of the hollow filaments 501 to 518 and 511 to 518.

(f) After cutting the support unit along the cutting line 7 shown by the dotted line in FIG. 7B, the release layer 3*b* and the release layer 3*d* positioned near the ends of the hollow filaments 501 to 508 are removed, and further, the release layer 3*a* and the release layer 3*c* positioned near the ends of the hollow filaments 511 to 518 are removed. Thus, the support unit for a microfluidic system shown in FIGS. 1A and 1B is completed.

As described above, the release layers 3*a*, 3*b*, 3*c* and 3*d* are provided on the surfaces of the ends of the first support 2 which become unnecessary and are ultimately removed, as shown in FIGS. 4A *and* 4B. This makes it even easier to carry out the process of drawing out the first hollow filament group constituted by the plurality of hollow filaments 501 to 508 and the second hollow filament group constituted by the plurality of hollow filaments 511 to 518 respectively from the ends of the support unit for a microfluidic system. However, care should be taken for the lengths of the exposed portions of the hollow filaments 501 to 508 and 511 to 518. The reason is as follows. The unexposed portions of the hollow filaments 501 to 508 and 511 to 518 are fixed, and it is thus easy to control factors such as temperature, flow velocity distribution, electrophoretic velocity distribution, and applied voltage, of the fluid within the hollow filaments 501 to 508 and 511 to 518. Meanwhile, the exposed portions of the hollow filaments 501 to 508 and 511 to 518 are not fixed and are in a free state, and it is thus difficult to control each of the above factors. Further, careless handling easily causes breakage of the exposed portions of the hollow filaments 501 to 508 and 511 to 518. Therefore, it is important to make the lengths of the exposed portions as short as possible, and it is preferred that the lengths of the exposed portions be at least shorter than the lengths of the unexposed portions.

Moreover, in the manufacturing method of the support unit for a microfluidic system according to the first embodiment of the present invention, the hollow members (hollow filaments) 501 to 508 and 511 to 518 are used. Therefore, appropriate thoughts should be put into design and manufacturing. Apart from the laying conditions on the intersection between the first hollow filament group and the second hollow filament group, there are thoughts put on forming conditions of the second support 6 serving as a protection film layer. Further, considerations should be made regarding laying conditions of the respective straight portions of the first hollow filament group constituted by the plurality of hollow filaments 501 to 508 and the second hollow filament group constituted by the plurality of hollow filaments 511 to 518, and curvature conditions on the hollow filaments 501 to 508 and 511 to 518. These conditions cannot be set generally since they largely depend on the material of the hollow filaments 501 to 508 and 511 to 518 and the specification of the first adhesive layer 1*a*. In other words, it is required to set design and manufacturing conditions suitable for the hollow filaments 501 to 508 and 511 to 518 and the first adhesive layer 1*a* to be used. If this operation is neglected, good hollow portions cannot be ensured and, in addition, defects occur in the hollow filaments 501 to 508 and 511 to 518, causing incidents such as leakage of a fluid.

Second Embodiment

Figure 8A:
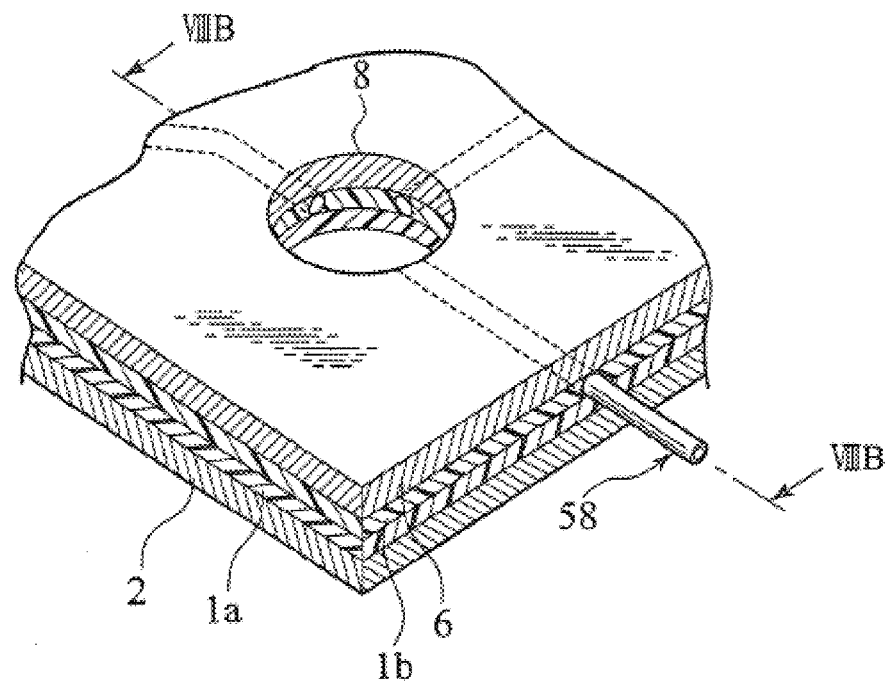
FIG. 8A is a bird's eye view of a support unit for a microfluidic system including a relay portion according to a second embodiment of the present invention.
Figure 8B:
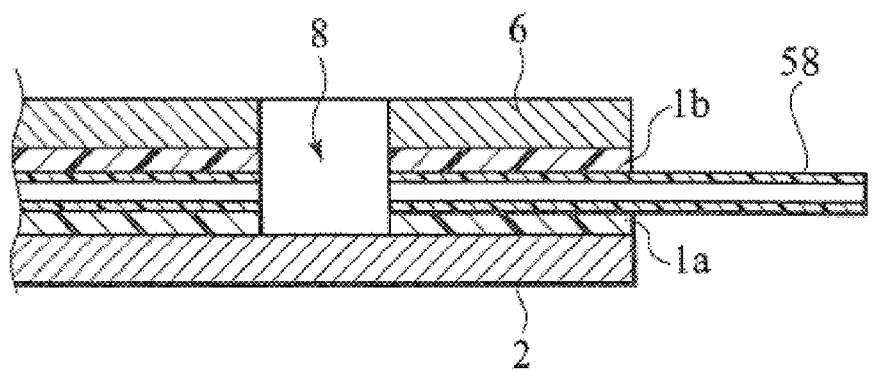
FIG. 8B is a cross sectional view along the line $VII_B$-$VII_B$.

As shown in FIGS. 8A and 8*b*, a support unit for a microfluidic system according to a second embodiment of the present invention is different from the support unit for a microfluidic system according to the first embodiment of the present invention shown in FIGS. 1A *and* 1B in that the support unit for a microfluidic system according to the second embodiment has an relay portion 8. The first adhesive layer 1*a*, the second adhesive layer 1*b*, and the second support 6 form the wall portion of the relay portion 8, and the first support 2 is the bottom portion of the same. The rest is similar to the first embodiment, and duplicated description is thus omitted.

As shown in FIGS. 8A and 8B, the relay portion 8 has a construction where hollow filaments 58 are exposed between the first adhesive layer 1*a* and the second adhesive layer 1*b*. The exposed hollow filaments 58 discharge a fluid. The relay portion 8 enables the discharged fluid to be mixed or branched. The shape and size of the relay portion 8 may be decided depending on the flow quantity of the fluid. For example, where the total thickness of flow channels formed by two or three hollow filaments 58 with φ200 μm, and the first adhesive layer 1*a* and the second adhesive layer 1*b*, which hold the hollow filaments 58, is 200 μm, the relay portion 8 may have a cylindrical shape with about φ2 mm to φ7 mm.

Laser beam machining is preferred for removal of the first adhesive layer 1*a*, the second adhesive layer 1*b*, and the hollow filaments 58 at a predetermined position which becomes the relay portion 8. Laser beam machining is particularly preferred where the volume of the removed portion, that is, the volume of the relay portion 8 is as small as a volume in cubic millimeters or smaller. A laser used for laser beam machining is a carbon dioxide gas laser, a YAG laser, an excimer laser, and the like, and may be selected depending on the materials of the first adhesive layer 1*a*, the second adhesive layer 1*b*, and the hollow filament 58. Note that, where the relay portion 8 is formed by a laser, it is preferred to use the first support 2 with a metal thin film such as a copper or aluminum film formed on the surface thereof. The metal thin film serves as a laser beam stopper. When the volume of the relay portion 8 is in cubic centimeters or larger and a large area is thus removed, machining by a drill or the like may be applied. In the case of machining, a desmear treatment for removing resin shavings produced while cutting is added.

A method of allowing the second support 6 to be a part of the relay portion 8 may be a process of machining the second support 6 to have a shape so that the second support 6 becomes a part of the relay portion 8. This process is carried out after the second support 6 is adhered to the second adhesive layer 1*b*. In this case, a method of sticking the second support 6 by a needle such as an injection needle, or the like, is appropriate.

Further, another method may be a method of machining the second support 6 to have a shape so that the second support 6 becomes a part of relay portion 8, simultaneously with the formation of the relay portion 8 in the first adhesive layer 1*a* and the second adhesive layer 1*b*. In this case, a method of machining the entire layers at once by the foregoing laser, or the like, is appropriate.

Further, yet another method may be a method of machining the second support 6 in advance to have a shape so that the second support 6 becomes a part of the relay portion 8, and then adhering the second support 6 to the second adhesive layer 1*b*. The method of machining the second support 6 may be drilling, punching, laser beam machining or the like.

According to the support unit for a microfluidic system according to the second embodiment of the present invention, provision of the relay potion 8 makes it possible to mix or branch a fluid flowing through the hollow filaments 58. Further, the second support 6 becomes a part of the relay portion 8. Thus, the relay portion 8 can have an open structure, enabling a new fluid to be filled into the relay portion from outside and enabling the fluid within the relay portion 8 to be removed.

Example 1

Kapton 300H by DuPont Corporation with a thickness of 75 μm was used as the first support 2. On the surface of the first support 2, a VBH A-10 film by 3M Corporation having a thickness of 250 μm and stickiness at room temperature was laminated by a roll laminator as shown in FIG. 2. As shown in FIGS. 3A and 3B, one-sided release paper was provided as the release layers 3*a*, 3*b*, 3*c* and 3*d* at desired positions on the first support 2 so that the release surfaces were closely adhered to the adhesive surface. Further, as shown in FIGS. 4A and 4B, the slits 4*a*, 4*b*, 4*c* and 4*d* were made by a cutter at desired positions in the first support 2. Then, as shown in FIG. 5A, the hollow filaments 501 to 508 and 511 to 518 constituted by high-performance engineering plastic tubes by Nirei Industry Co., Ltd. (material: PEEK, inner diameter of 0.2 mm, outer diameter 0.4 mm) 62 were laid onto the first support 2 by using an NC wiring machine 61 which is capable of output control of ultrasonic vibration and a load and capable of moving an X-Y table by NC control. A lord of 80 g and vibration by an ultrasonic wave with frequency of 30 kHz were applied to the hollow filaments 501 to 508 and 511 to 518 to be laid. As shown in FIG. 5B, the hollow filaments 501 to 508 and 511 to 518 were laid to have an arcuate shape with a radius of 5 mm and an intersection therebetween was provided. The load and ultrasonic vibration could be stopped near the intersection. Kapton 300H by DuPont Corporation, on which a VBH A-10 film by 3M Corporation was laminated by the use of a roll laminator, was used as the second support 6. The second support 6 was laminated by a vacuum laminator on the surface of the second filament group constituted by the plurality of hollow filaments 511 to 518, as shown in FIGS. 6A and 6B. Thereafter, a laser beam driller for drilling small diameter holes in a printed circuit board was used for machining of the outer shape, and a hole with ϕ0.2 mm was made at an interval of 0.1 mm with a pulse width of 5 ms and four shots, and the support unit was cut into a wide cross shape along the desired cutting line 7 shown in FIG. 7B. At this time, the support unit was cut so as to overlap the portions where the slits 4a, 4b, 4c and 4d had been respectively made in advance in the positions where the eight hollow filaments in 0.4 mm-pitch were collectively in flat cable shape. Thereafter, the portions of the first support 2, where the release layers 3a, 3b, 3c and 3d had been stuck near the ends of the hollow filaments 501 to 508 and 511 to 518, could be easily removed. Then, a support unit for a microfluidic system was fabricated so that the support unit had a shape where the first hollow filament group constituted by eight hollow filaments 501 to 508 with an overall length of 20 cm and the second hollow filament group constituted by the hollow filaments 511 to 518 with an overall length of 20 cm were exposed at their ends, and the length of each exposed end was 10 mm. There was no breakage in the entire portions where the hollow filaments were laid, particularly in the portion where the hollow filaments intersect with each other.

As a result, variations in positions of the flow channels formed by the first hollow filament group constituted by the plurality of hollow filaments 501 to 508 and the second hollow filament group constituted by the plurality of hollow filaments 511 to 518 were within +/−10 μm or smaller with reference to a design drawing. The support unit for a microfluidic system was put in a thermoregulator, and the temperature was maintained at 80 degrees centigrade. Liquid color ink was then flown from one ends of the hollow filaments, and duration of time until the ink was flown out were measured by a measurement instrument such as a stopwatch. The ink flew out from the other ends of the eight hollow filaments almost at the same moment (+/−1 second or shorter).

Example 2

A 0.5 mm-thick aluminum plate was used as the first support 2. Then, as shown in FIG. 2, a non-stick pressure sensitive adhesive S9009 by Dow Corning Asia Ltd. was laminated onto the surface of the aluminum plate as the first adhesive layer 1a by a roll laminator. Further, as shown in FIGS. 3A and 3B, the release layers 3a, 3b, 3c and 3d made of one-sided release paper were provided as films without stickiness onto the surfaces of the portions of the first adhesive layer 1a, which were near the ends of the hollow filaments and would be unnecessary. The release layers 3a, 3b, 3c were provided so that the release surfaces thereof were closely adhered to the adhesive surface. As shown in FIGS. 4A and 4B and FIGS. 5A and 5B, glass tubes ESG-2 by Hagitec Co., Ltd. (inner diameter of 0.8 mm and outer diameter of 1 mm) were laid on the above layers by using the NC wiring machine 61 capable of output control of ultrasonic vibration and a load, and capable of moving an X-Y table by NC control. A lord of 100 g and vibration by an ultrasonic wave with frequency of 20 kHz were applied to the hollow filaments 501 to 508 and 511 to 518 to be laid. As shown in FIG. 5B, the hollow filaments 501 to 508 and 511 to 518 were laid to have an arcuate shape with a radius of 10 mm and an intersection therebetween was provided. The load and an ultrasonic vibration were stopped near the intersection. Kapton 200H by DuPont Corporation, which is the same as the film support, was used as the second support 6 and laminated by a vacuum laminator on the support unit on which the hollow filaments 501 to 508 and 511 to 518 had been laid, as shown in FIGS. 6A and 6B. At this time, thermocouples for temperature measurement were buried near the inlet, outlet and intersection of the hollow filaments 501 to 508 and 511 to 518. Thereafter, for machining of the outer shape shown in FIGS. 7A and 7B, the support unit was cut into a desired shape by using an outer shape process machine for a printed circuit board. At this time, the support unit was cut so as to overlap the portions where the slits 4a, 4b, 4c and 4d had been respectively made in the portion where twelve hollow filaments with 1 mm-pitch were collectively in flat cable shape. Thereafter, the portions of the support, where the non-stick films had been stuck near the ends of the plurality of hollow filaments 501 to 508 and 511 to 518, could be easily removed. Then, a support unit for a microfluidic system was fabricated to have a shape where the twelve hollow filaments 501 to 508 and 511 to 518 with an overall length of 40 cm were exposed with each exposed portion having a length of 50 mm. Variations in positions of the flow channels formed by the hollow filaments 501 to 508 and 511 to 518 were within +/−20 μm or smaller with reference to a design drawing. There was no breakage in the entire portions where the hollow filaments were laid, particularly in the portion where the hollow filaments 501 to 508 and 511 to 518 intersect with each other.

A film heat FTH-40 by Kyohritsu Electronic Industry Co., Ltd. was stuck to the entire back surface of the aluminum plate and temperature was set at 90 degrees centigrade. Water at about 20 degrees centigrade was flown from the one ends of the hollow filaments, and temperature of water flown out from the other ends was measured. The measured temperature was 88+/−1 degrees centigrade. Moreover, temperature at the inlet, outlet and intersection was 89+/−0.5 degrees centigrade, and temperature could be accurately regulated.

Example 3

As shown in FIGS. 8A and 8B, a copper-clad laminate (plate thickness of 0.2 mm) having 18 μm-thick copper on its surface was used as the first support 2. On the surface of the copper-clad laminate, a pressure sensitive adhesive S9009 by Dow Corning Asia Ltd. (thickness of 200 μm), which is non-stick at room temperature, was laminated by a roll laminator as the first adhesive layer 1a and the second adhesive layer 1b. High-performance engineering plastic tubes by Nirei Industry Co., Ltd. (material: PEEK, inner diameter of 0.2 mm, outer diameter of 0.4 mm) were laid by using a wiring machine for multi-wiring, which is capable of output control of ultrasonic vibration and a load and capable of moving an X-Y table by NC control. A load of 80 g and vibration by an ultrasonic wave with frequency of 30 kHz were applied to the hollow filaments 58 to be laid. The hollow filaments 58 were laid to have an arcuate shape with a radius of 5 mm and an intersection therebetween was provided. The load and ultrasonic vibration was stopped near the intersection. Kapton 200H by DuPont Corporation, on which S9009 by Dow Corning Asia Ltd. (thickness of 200 μm) was laminated by a roll laminator, was used as the second support 6. The second support 6 was laminated by a vacuum laminator on the surface where the hollow filaments 58 were laid.

Thereafter, a laser beam driller for small diameter holes in a printed circuit board was used with a pulse width of 5 ms and 4 shots to make a hole with φ0.2 mm in the second support 6, the first adhesive layer 1a, the second adhesive layer 1b and the hollow filaments 58, at the position which would be the relay portion 8. Thereafter, a router was used to process the outer shape, thus fabricating a support unit for a microfluidic system having the relay portion 8 where a plurality of flow channels is connected to each other.

Other Examples

The present invention has been described based on the foregoing aspects. However, it should be understood that the sections and drawings constituting a part of this disclosure do not limit this invention. Various alternative embodiments, examples and application technologies will be apparent to those skilled in the art from this disclosure.

For example, as shown in FIG. 9A, a through hole is provided in a part of the support unit for a microfluidic system. The support unit may be used like a micropump or a microvalve which applies a time-periodic force to a part of a hollow filament 58 by using a motor with a cam, or the like, to deform the hollow filament at the position where the force is applied, thus moving a fluid at the position and causing pulsating flow. In this case, it is preferred that the hollow filament 58 have elasticity. In particular it is preferred that Youngs modulus of the hollow filament 58 is $10^3$ MPa or lower.

Figure 9B:
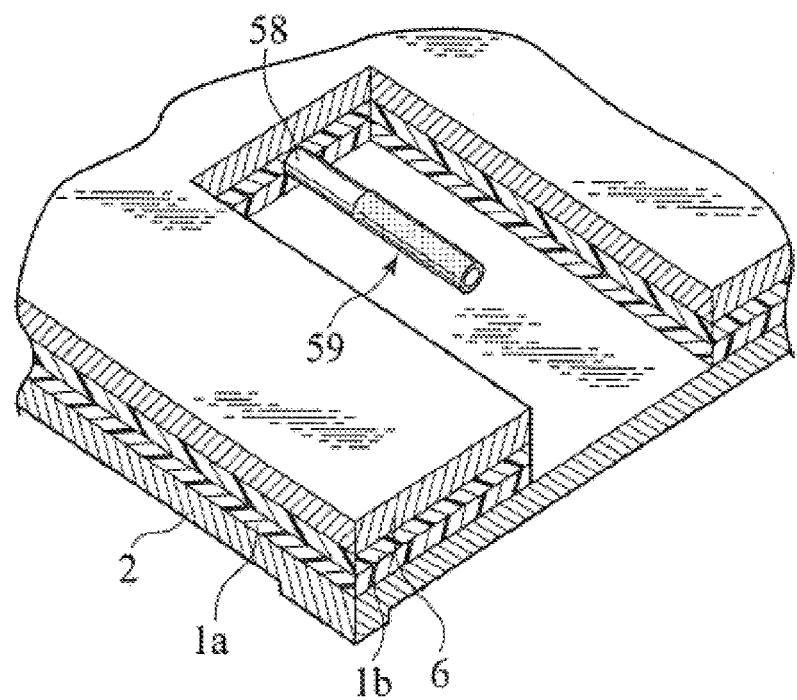
FIG. 9B is a bird's eye view (No. 2) explaining a configuration of a hollow filament for a support unit for a microfluidic system according to another embodiment of the present invention.

Moreover, as shown in FIG. 9B, it is possible to form a metal film 59 on a part of the exposed hollow filament 58 to form a terminal to which a voltage or the like is applied. In this case, it is preferred that the metal film 59 be formed by plating or deposition of a single layered or multi-layered Cu, Al, nickel (Ni), chrome (Cr), gold (Au), or the like.

Figure 10:
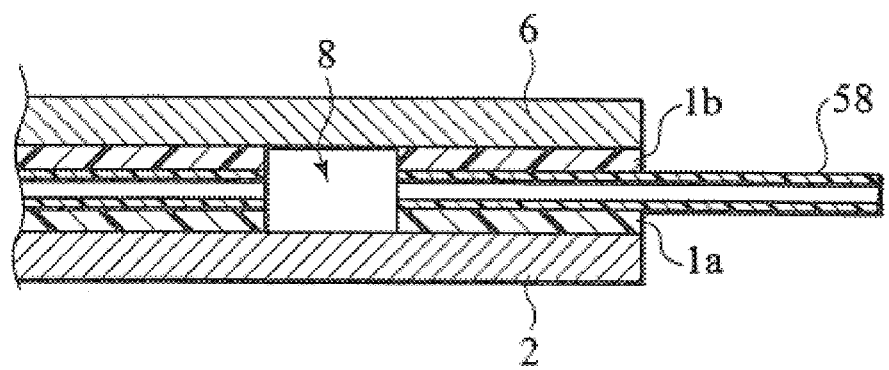
FIG. 10 is a cross sectional view of a support unit for a microfluidic system including a relay portion according to another embodiment of the present invention.
Figure 11A:
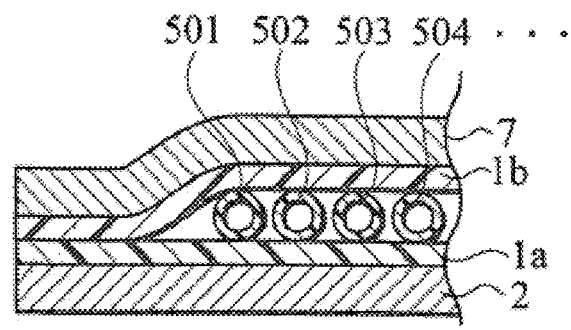
FIG. 11A is a cross sectional view viewed in the arrow direction along the line XIA-XIA of a plan view of a support unit for a microfluidic system shown in FIG. 11C, according to yet another embodiment of the present invention.
Figure 11B:
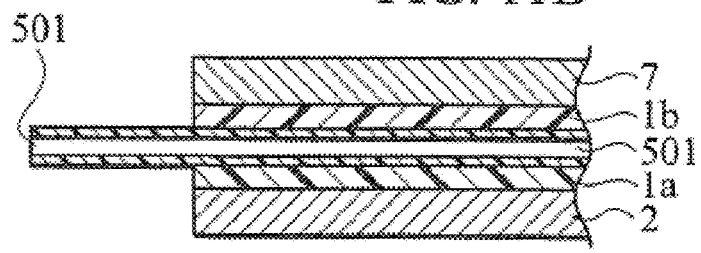
FIG. 11B is a cross sectional view viewed in the arrow direction along the line XIB-XIB of the plan view shown in FIG. 11C.
Figure 11C:
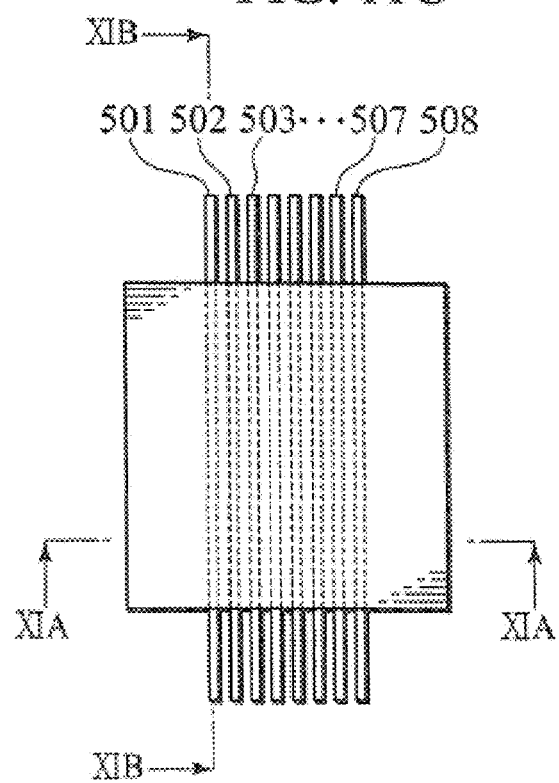
Figure 12:
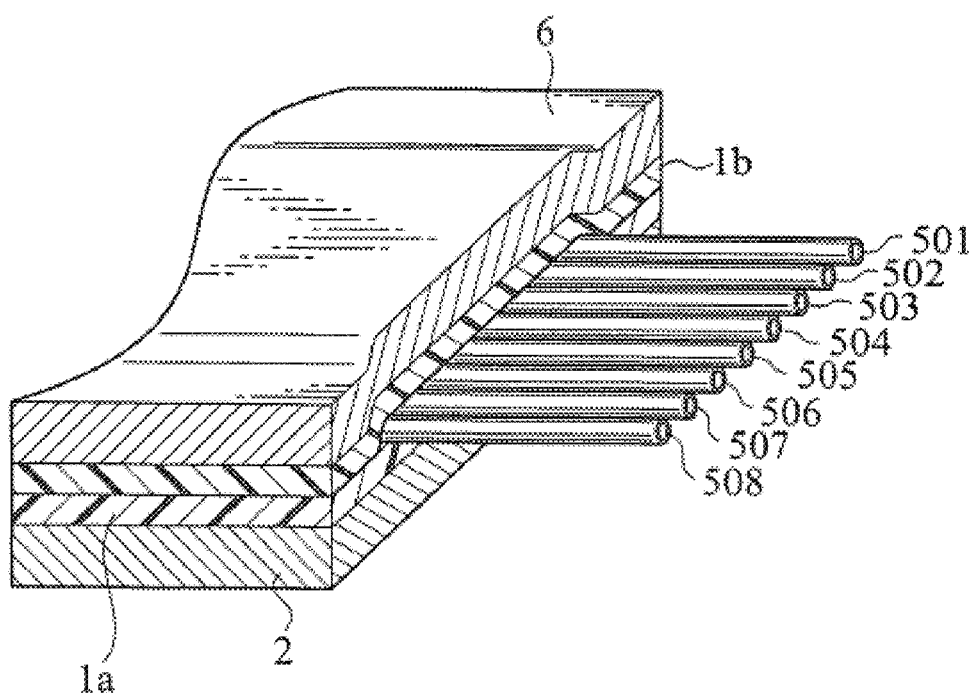
FIG. 12 is a bird's eye view of the support unit for a microfluidic system according to yet another embodiment of the present invention shown in FIGS. 11A to 11C.

Further, as shown in FIGS. 8A and 8B, the support unit for a microfluidic system is provided with the relay portion 8 which is an opening portion. However, where the relay portion 8 is only for mixing or branching a fluid, the relay portion 8 may have a closed structure without removing the second support 6 as shown in FIG. 10.

Furthermore, the first hollow filament group and the second hollow filament group do not necessarily intersect with each other at 90 degrees and may only intersect with each other. Therefore, for example, not only the first and second hollow filament groups but also a third hollow filament group may be laid.

On the other hand, the hollow filaments do not necessarily intersect with each other. As shown in FIGS. 11A to 11C and 12, there may be only the first hollow filament group constituted by the plurality of hollow filaments 501 to 508 running in one direction.

Figure 13:
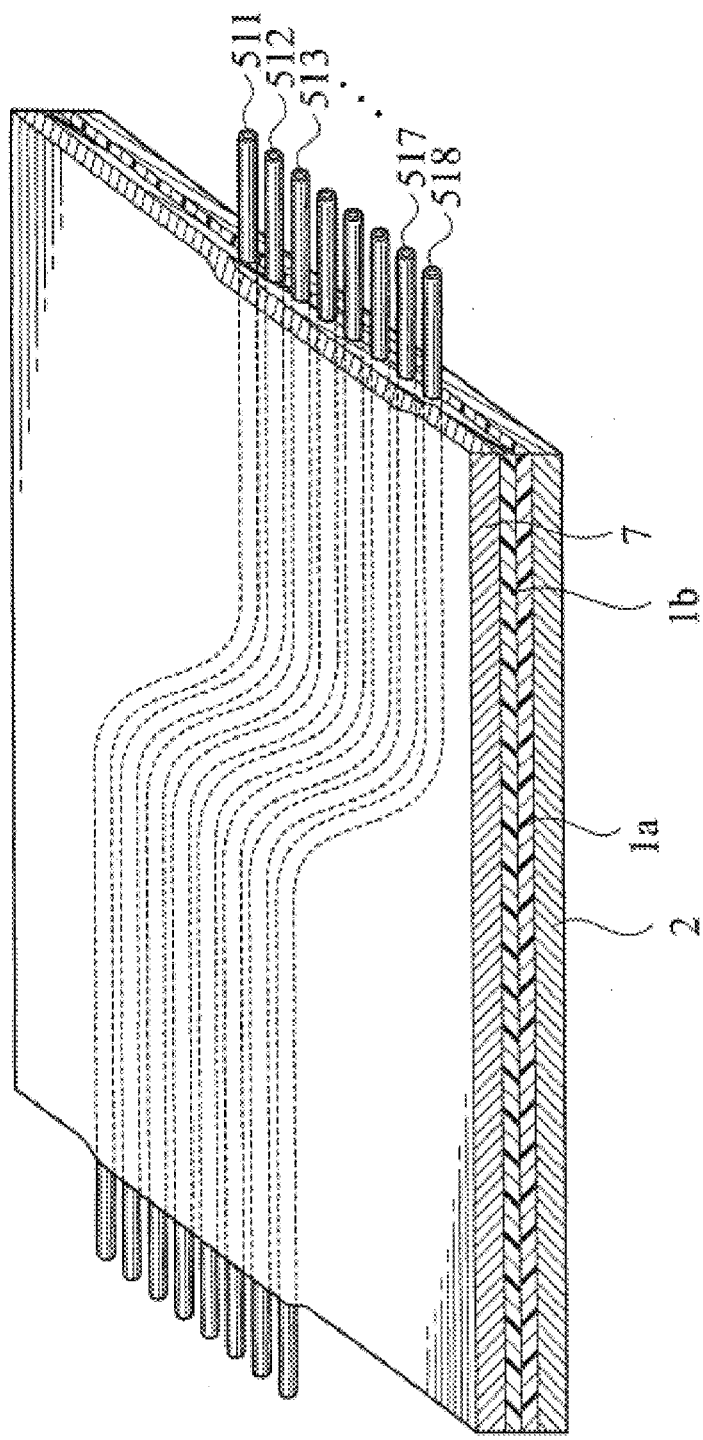
FIG. 13 is a bird's eye view showing a modification of the support unit for a microfluidic system according to yet another embodiment of the present invention.

Moreover, as shown in FIG. 13, the plurality of hollow filaments 511 to 518 with curvatures may be laid.

Note that the number of the hollow filaments to be laid is not necessarily plural. In other words, the number of the hollow filaments to be laid may be single.

INDUSTRIAL APPLICABILITY

As described above, according to the present invention, it is possible to provide a support unit for a microfluidic system, which is easily manufactured and has a long flow channel in centimeters that does not limit the number of steps and an amount of a fluid for reaction and analysis.

As a result, according to the present invention, it is possible to provide a fluidic circuit (a microfluidic system) with good accuracy and fewer manufacturing variations. Further, it is possible to three-dimensionally lay the first hollow filament group constituted by the plurality of hollow filaments and the second hollow filament group constituted by the plurality of hollow filaments, which intersects with the first hollow filament group orthogonally. Thus, a small microfluidic system can be provided even with a complicated flow circuit.

Moreover, according to the present invention, it is possible to provide a support unit for a microfluidic system in which hollow filaments are arrayed to serve as fluidic channels, and a method of manufacturing such a support unit for a microfluidic system with good accuracy and less manufacturing variations.

What is claimed is:

1. A support unit for a microfluidic system, comprising:
a first support;
a first adhesive layer provided on a surface of the first support; and
at least two hollow filaments disposed on a surface of the first adhesive layer and functioning as a flow channel layer of the microfluidic system,
a second support and,
a second adhesive layer provided on a surface of the second support, wherein the first adhesive layer and the second adhesive layer are stuck together with the at least two hollow filaments being therebetween,
wherein the at least two hollow filaments are fixed on the first support, and at least one of the at least two hollow filament intersects, contacts and crosses over at least one of the other at least two hollow filaments,
wherein fluids flowing through the at least two hollow filaments do not come into contact at the intersection of the intersecting hollow filaments,
wherein the at least two hollow filaments comprise hollow filaments that have a beginning end which is exposed and extends from the first su ort and that have an ending end which is exposed and extends from the first support, and
wherein a length of the beginning end and a length of the ending end are each shorter than a length of an unexposed portion of the at least two hollow filaments.

2. The support unit for a microfluidic system according to claim 1, wherein a metal film is formed on an outside part and surrounds an end of at least one of the at least two hollow filaments and the at least one of the at least two hollow filaments is made from a material selected from the group consisting of an organic material, glass, quartz, and carbon.

3. The support unit for a microfluidic system according to claim 2, wherein the organic material is selected from the group consisting of polyvinyl chloride resin (PVC), polyvinylidene chloride resin, polyvinyl acetate resin, polyvinyl alcohol resin (PVA), polystyrene resin (PS), acrylonitrile butadiene styrene copolymer (ABS), polyethylene resin (PE), ethylene-vinyl acetate copolymer (EVA), polypropylene resin (PP), poly-4-methylpentene (TPX), polymethyl methacrylate (PMMA), PEEK, PI, PEI, PPS, cellulose acetate, polytetrafluoroethylene resin (PTFE), tetrafluoroethylene-hexafluoropropylene resin (FEP), PFA, polyethylene-tetrafluoroethylene copolymer (ETFE), polychlorotrifluoroethylene (PCTFE), polyvinylidene fluoride (PVDF), polyethylene terephthalate resin (PET), polyamide resin (nylon), polyacetal (POM), polyphenylene terephthalate (PPT), polycarbonate resin (PC), polyurethane resin, polyesterelastomer, polyolefin resin, silicone resin, and polyimide resin.

4. The support unit for a microfluidic system according to claim 1, wherein at least one of the at least two hollow filaments is partially provided with an optically transparent portion.

5. The support unit for a microfluidic system according to claim 1, wherein at least one of the at least two hollow filaments have light permeability.

6. The support unit for a microfluidic system according to claim 1, wherein a laying shape of the at least two hollow filaments is fixed by the first adhesive layer.

7. The support unit for a microfluidic system according to claim 1, wherein there is a cavity within a circumference of at least one of the at least two hollow filaments.

8. The support unit for a microfluidic system according to claim 1, wherein a terminal or a circuit is formed on the surface at least one of the first support and the second support.

9. The support unit for a microfluidic system according to claim 1, wherein at least one part selected from the group consisting of a micromachine, a heat generation element, a piezoelectric element, a sensor, an electronic part, and a light part is formed on the surface of at least one of the first support and the second support.

10. The support unit for a microfluidic system according to claim 1, wherein the second adhesive layer has the same shape and has the same size as the first support.

* * * * *